(12) United States Patent
Nabetani et al.

(10) Patent No.: US 6,385,040 B2
(45) Date of Patent: May 7, 2002

(54) CARD-SHAPED STORAGE MEDIUM AND INFORMATION PROCESSING APPARATUS HAVING GUIDE PORTION FOR THE SAME

(75) Inventors: Hitoshi Nabetani; Yoshihiro Uchino, both of Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/789,998

(22) Filed: Feb. 21, 2001

Related U.S. Application Data

(62) Division of application No. 09/229,948, filed on Jan. 13, 1999, now Pat. No. 6,129,231, which is a division of application No. 08/971,765, filed on Nov. 17, 1997, now Pat. No. 5,889,649, which is a continuation of application No. 08/394,131, filed on Feb. 24, 1995, now abandoned.

(30) Foreign Application Priority Data

Mar. 1, 1994 (JP) .............................................. 6-031390
Apr. 13, 1994 (JP) .............................................. 6-074893

(51) Int. Cl.$^7$ ................................................ G06F 1/16
(52) U.S. Cl. ........................ 361/684; 361/740; 439/159
(58) Field of Search ........................ 361/679, 683–686, 361/729–732, 740, 747, 754, 759; 439/153–154, 155, 159

(56) References Cited

U.S. PATENT DOCUMENTS 5,715,139 A * 2/1998 Nakajima .................... 361/683
6,178,084 B1 * 1/2001 Shibasaki .................... 361/683
6,227,879 B1 * 5/2001 Dong .......................... 439/92

* cited by examiner

Primary Examiner—Leo P. Picard
Assistant Examiner—Hung Van Duong
(74) Attorney, Agent, or Firm—Robin, Blecker & Daley

(57) ABSTRACT

An information processing apparatus which employs a card-shaped storage medium includes guide portions having a plurality of temporarily fastening portions for temporarily fastening the card-shaped storage medium at their respective locations, one of which is a first location at which the card-shaped storage medium is electrically connected to the apparatus and another of which is a second location at which the card-shaped storage medium is not electrically connected to the information processing apparatus.

15 Claims, 14 Drawing Sheets

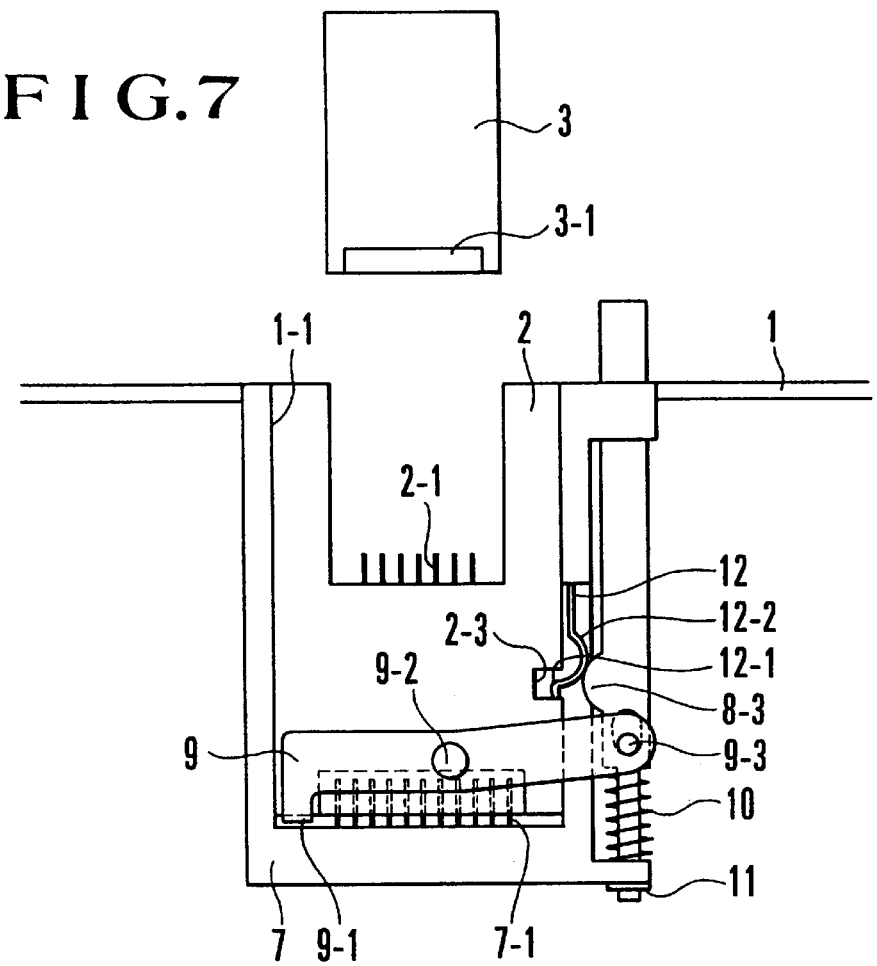
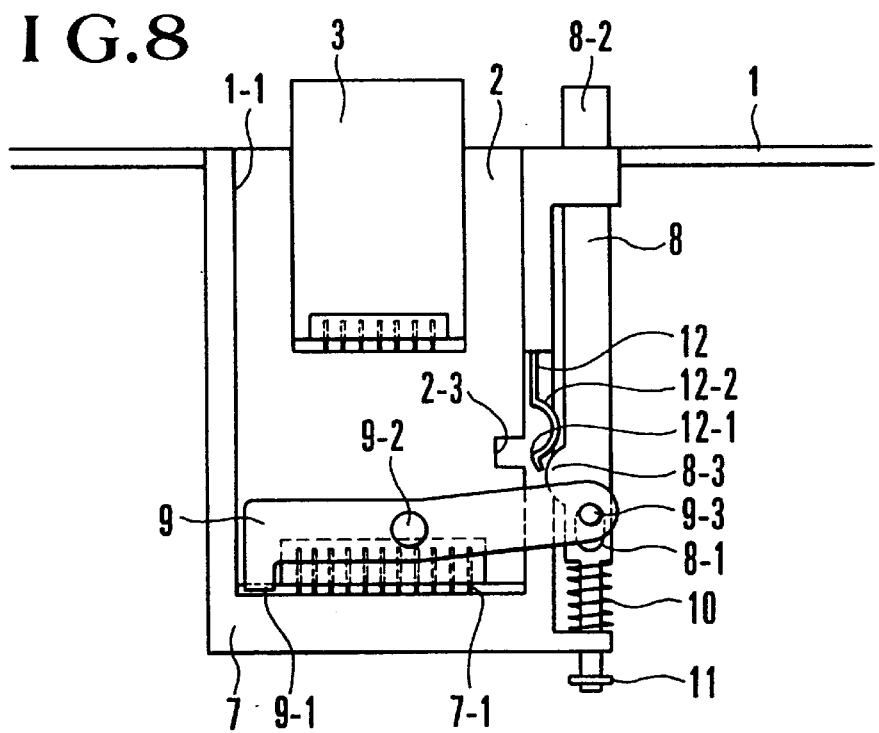

CARD-SHAPED STORAGE MEDIUM AND INFORMATION PROCESSING APPARATUS HAVING GUIDE PORTION FOR THE SAME

CROSS-REFERENCE TO RELATED APPLICATIONS

This application is a divisional of application Ser. No. 09/229,948 now U.S. Pat. No. 6,129,231 dated Apr. 17, 2001, which is a divisional of Ser. No. 08/971,765, filed Nov. 17, 1997 (U.S. Pat. No. 5,889,649), which is a continuation of Ser. No. 08/394,131, filed Feb. 24, 1995 (abandoned).

BACKGROUND OF THE INVENTION

1. Field of the Invention

The present invention relates to a card-shaped storage medium which includes a storage medium in its inside and to an information processing apparatus in which to mount the card-shaped storage medium.

2. Description of the Related Art

FIGS. 1 and 2 are perspective views showing a related art. Referring to FIG. 1, a card-shaped storage medium 201, which has a storage medium (not shown) in its inside, includes an electrode terminal portion 202. The information processing apparatus (part of which is shown) includes a connector 204 for the card-shaped storage medium 201, which is provided in the inside of the information processing apparatus employing the card-shaped storage medium 201, guide portions 205a and 205b provided on the connector 204, an electrode terminal portion 208 of the connector 204, and a printed circuit board 209 on which the connector 204 is mounted and which is incorporated in the information processing apparatus. When a user is to use the card-shaped storage medium 201, the user inserts the card-shaped storage medium 201 along the guide portions 205a and 205b of the connector 204 in the direction of the shown arrow and connects the electrode terminal portions 202 and 208 to each other. After the use of the card-shaped storage medium 201, the user ejects the card-shaped storage medium 201 along the guide portions 205a and 205b of the connector 204 in the direction opposite to that of the arrow shown in FIG. 1. FIG. 2 shows the state in which the card-shaped storage medium 201 is in use. As shown in FIG. 2, during the use of the card-shaped storage medium 201, the electrode terminal portion 202 of the card-shaped storage medium 201 and the electrode terminal portion 208 of the connector 204 are connected to each other, i.e., the card-shaped storage medium 201 and the internal electrical circuit of the information processing apparatus are electrically connected to each other.

However, the above-described related art has the following disadvantages.

(1) The card-shaped storage medium 201, when mounted in the information processing apparatus, is held only by the electrode terminal portions 202 and 208. As a result, if the electrode terminal portions 202 and 208 have a larger number of electrode terminals, a larger force will be needed to insert or eject the card-shaped storage medium 201. Conversely, as the number of electrode terminals becomes smaller, the force with which the card-shaped storage medium 201 is held in the information processing apparatus becomes weaker, so that the card-shaped storage medium 201 will easily come off owing to a vibration or the like of the information processing apparatus.

(2) If the user accidentally takes his/her hand off the card-shaped storage medium 201 while it is being ejected, the card-shaped storage medium 201 will drop from the apparatus and be damaged.

(3) Since the user cannot obtain a distinct click touch when the card-shaped storage medium 201 is inserted into the apparatus, he/she cannot judge whether the card-shaped storage medium 201 has been completely mounted in the apparatus.

(4) The electrode terminal portion 202 of the card-shaped storage medium 201 contains not only signal terminals, a grounding terminal and a power source terminal but also a terminal through which to detect whether the card-shaped storage medium 201 has been mounted in the apparatus. Since the electrode terminal portion 202 needs such a large number of electrode terminals, it is difficult to reduce the entire size of the electrode terminal portion 202 and a large force is needed to insert or eject the card-shaped storage medium 201.

(5) A plurality of electrode terminals are allocated for grounding and a power source to lower the contact resistance of the electrode terminal portion of the card-shaped storage medium 201.

(6) After data stored in a first child storage medium has been read into the information processing apparatus, if data stored in a second child storage medium is to be read into the information processing apparatus, the user needs to perform the awkward operation of temporarily removing a storage medium adapter from the information processing apparatus, mounting the second child storage medium in the storage medium adapter in place of the first child storage medium, and inserting the storage medium adapter into the information processing apparatus.

(7) If the user frequently repeats the operation of mounting and removing the storage medium adapter onto and from the connector of the information processing apparatus, the reliability of the connector will be impaired.

(8) In the case of an arrangement which allows the child storage medium to be removed from the storage medium adapter without removing the storage medium adapter from the information processing apparatus, since there is no locking mechanism, load, such as twisting force, may be applied to and cause damage to the connector of the information processing apparatus. This leads to a decrease in the reliability of the electrical connection between the child storage medium and the connector of the information processing apparatus.

SUMMARY OF THE INVENTION

It is, therefore, an object of the present invention to solve the above-described problems.

To achieve the above-described object, according to one aspect of the present invention, there is provided a storage medium adapter which is capable of being inserted into a storage medium inserting portion provided in an information processing apparatus and which includes a holder portion arranged to hold at least one child storage medium in an electrically connectable state, and means for allowing the child storage medium inserted into the holder portion to access the information processing apparatus. The storage medium adapter is arranged so that the child storage medium can be ejected alone when it is inserted into the information processing apparatus in the state of being held by the storage medium adapter.

According to another aspect of the present invention, the information processing apparatus is provided with means for locking the storage medium adapter during ejection of only the child storage medium. The storage medium adapter has a cutout portion, and the information processing apparatus has a locking member to engage with the cutout portion. When the storage medium adapter is inserted into the information processing apparatus, the locking member engages with the cutout portion, thereby locking the storage medium adapter.

According to another aspect of the present invention, the information processing apparatus is provided with a storage medium ejecting mechanism, and the locking member is arranged to unlock the storage medium adapter in interlocked relationship to the operation of ejecting the storage medium adapter by the storage medium ejecting mechanism.

According to another aspect of the present invention, the information processing apparatus includes a storage medium guiding portion having a cutout portion, and the storage medium adapter has a locking member to engage with the cutout portion provided in the storage medium guiding portion of the information processing apparatus. The locking member is arranged to lock the storage medium adapter by engaging with the cutout portion.

According to another aspect of the present invention, the storage medium adapter has an ejecting mechanism for ejecting the child storage medium, and the storage medium adapter is locked in interlocked relationship to the operation of ejecting the child storage medium by the ejecting mechanism.

According to still another aspect of the present invention, the storage medium adapter has an ejecting-mechanism operating member for the child storage medium, and the information processing apparatus has a storage-medium ejecting mechanism operating member. The ejecting-mechanism operating member for the child storage medium and the storage-medium ejecting mechanism operating member of the information processing apparatus are disposed in such a manner as to be opposed to each other across the child storage medium.

To achieve the above-described object, according to another aspect of the present invention, there is provided an arrangement in which projections are respectively provided on part of guide portions for a card-shaped storage medium. In such arrangement, the card-shaped storage medium is fastened by the projections between the guide portions for the card-shaped storage medium, and the card-shaped storage medium is temporarily fastened between the guide portions during the use of the card-shaped storage medium and when the card-shaped storage medium is being ejected.

According to another aspect of the present invention, the projections are formed of material having elasticity.

According to another aspect of the present invention, members which project inward from the respective guide portions for the card-shaped storage medium are formed of material having electrical conductivity (such as metal or electrically conductive rubber). In such arrangement according to this aspect, since the projecting members having electrical conductivity are electrically connected to the internal electrical circuit of the apparatus, it is possible to reduce the number of electrode terminals of the card-shaped storage medium or to lower the contact resistance of the electrode terminals of the card-shaped storage medium.

According to another aspect of the present invention, guide portions for the card-shaped storage medium, which are provided for holding the card-shaped storage medium within the information processing apparatus, are each provided with a projection and a member having elasticity, and recesses are formed in the card-shaped storage medium at locations respectively selected to correspond to the projections when the card-shaped storage medium is mounted. In such arrangement according to this aspect, when the card-shaped storage medium reaches a predetermined position between the guides, the projections on the respective guide portions are fitted into the corresponding recesses in the card-shaped storage medium, whereby users can obtain a distinct click touch.

According to another aspect of the present invention, projections made of material having elasticity are provided on part of the exterior of the card-shaped storage medium. In such arrangement according to this aspect, the card-shaped storage medium is fastened by the elasticity of the projections between the guide portions for the card-shaped storage medium, whereby the card-shaped storage medium is lightly fastened during the use thereof.

According to another aspect of the present invention, members which project from part of the exterior of the card-shaped storage medium are made of material having electrical conductivity (such as metal or electrically conductive rubber). In such arrangement according to this aspect, since the projecting members having electrical conductivity are electrically connected to the internal electrical circuit of the card-shaped storage medium, it is possible to reduce the number of the electrode terminals of the card-shaped storage medium or to lower the contact resistance of the electrode terminals of the card-shaped storage medium.

According to another aspect of the present invention, the card-shaped storage medium is prevented from easily coming off the apparatus during the use thereof.

The above and other objects, features and advantages of the present invention will become apparent from the following detailed description of preferred embodiments of the present invention, taken in conjunction with the accompanying drawings.

BRIEF DESCRIPTION OF THE DRAWINGS

FIG. 7 is a detailed view of the ejecting mechanism according to the first embodiment;

FIG. 8 is a detailed view of the ejecting mechanism according to the first embodiment;

DETAILED DESCRIPTION OF THE PREFERRED EMBODIMENTS

Preferred embodiments of the present invention will be described below with reference to the accompanying drawings.

First of all, a system arrangement according to the present invention for enabling data to be exchanged between an information processing apparatus and a portable device will be described below with reference to FIG. 3.

Figure 1:
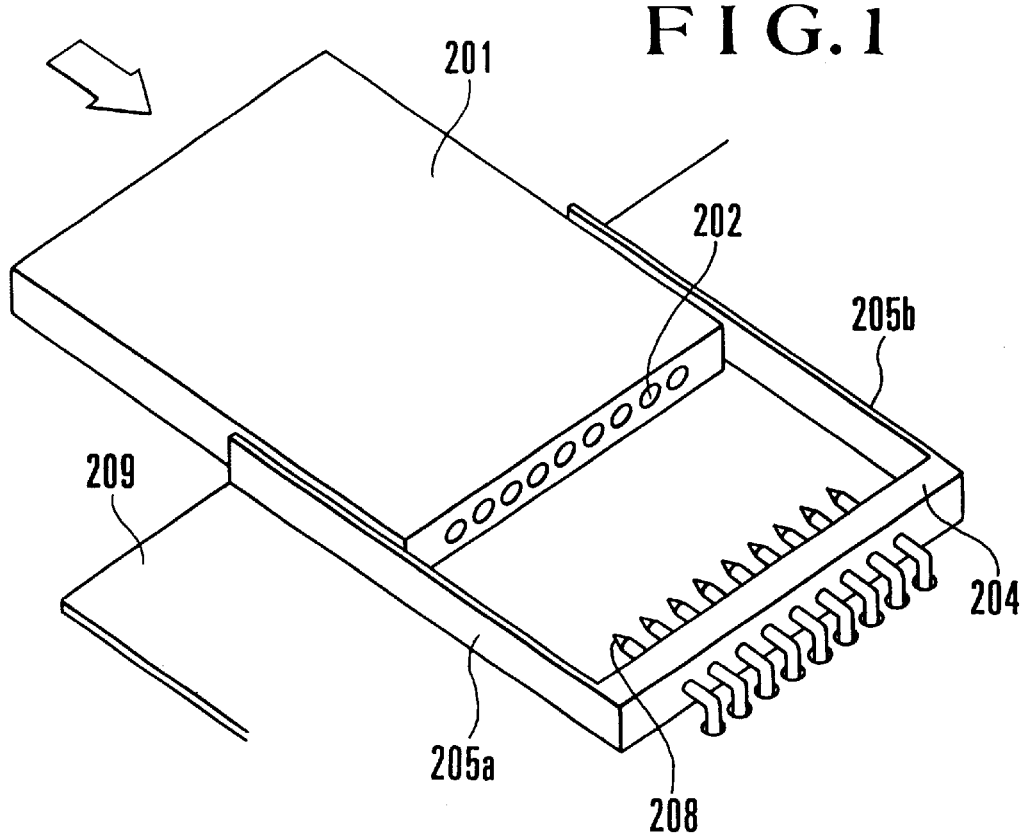
FIG. 1 is a schematic, perspective view showing a state in which a card-shaped storage medium according to a related art is being inserted.
Figure 2:
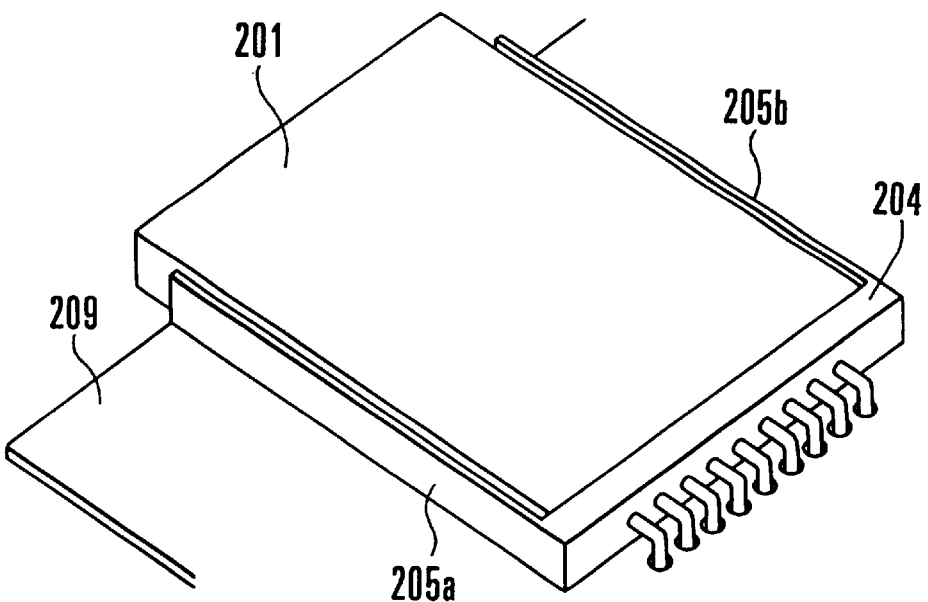
FIG. 2 is a schematic, perspective view showing a state in which the card-shaped storage medium according to the related art is used.
Figure 3:
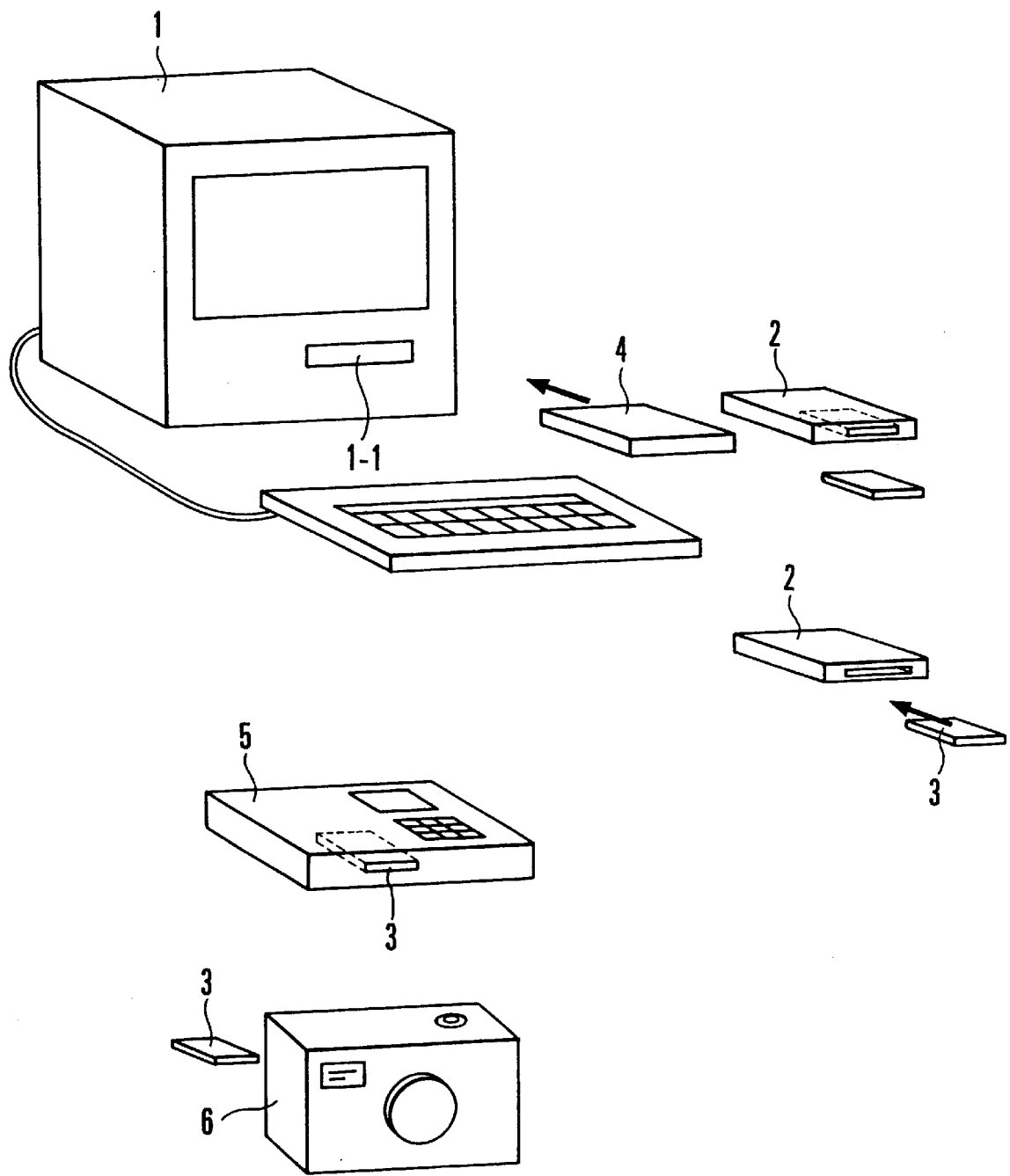
FIG. 3 is a schematic view showing a system arrangement according to a first embodiment of the present invention.
Figure 4:
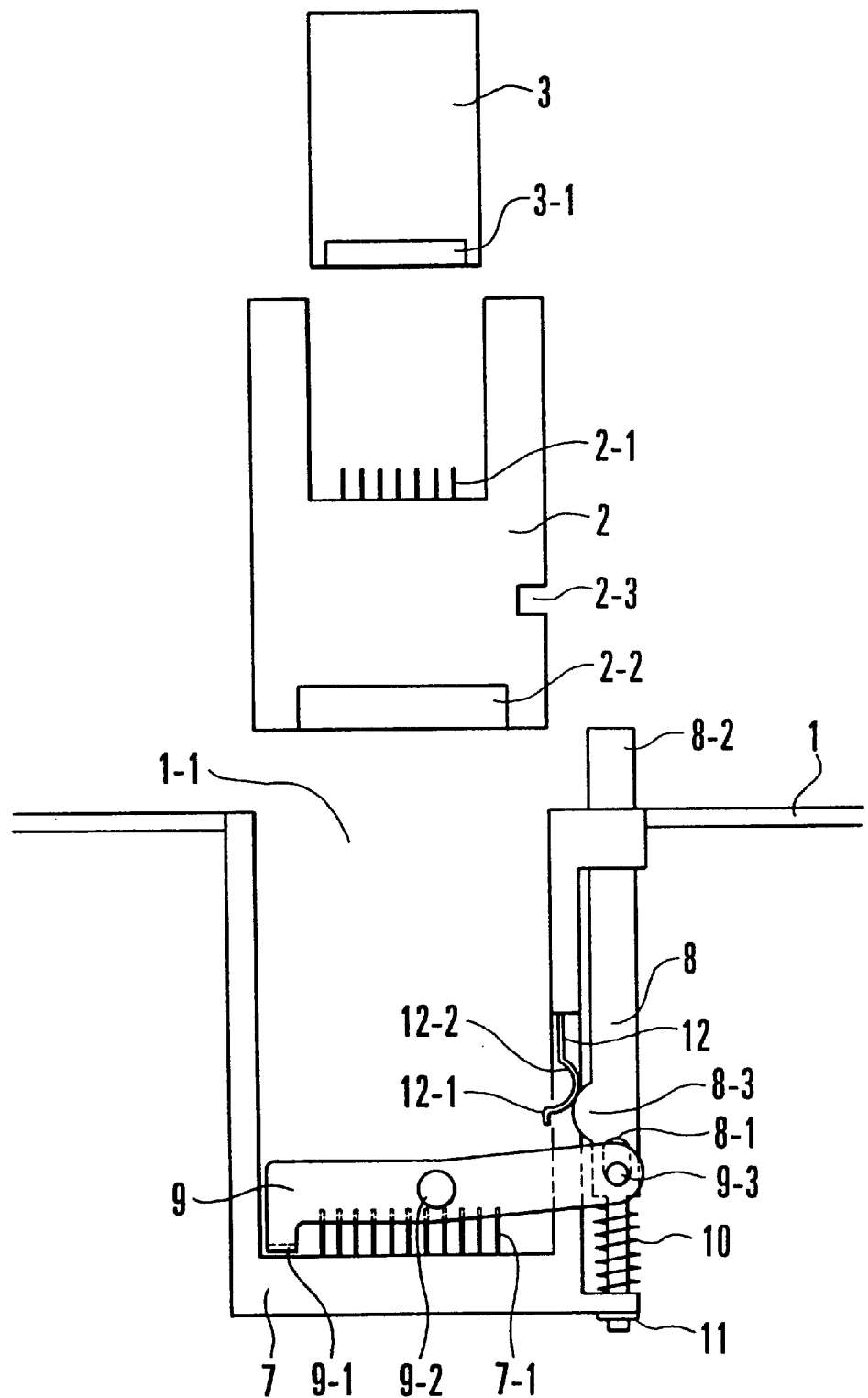
FIG. 4 is a detailed view of an ejecting mechanism according to the first embodiment of the present invention.

Referring to FIG. 3, a computer 1 which is one example of an information processing apparatus has a storage medium holding part 1-1 which conforms to PCMCIA standards.

A storage medium 4 is a so-called PC card which conforms to the PCMCIA standards, and a personal organizer 5 and an electronic camera 6 are respectively capable of accommodating memory cards 3 which are exclusive child storage media. Data obtained at the personal organizer 5 and the electronic camera 6 are held in the respective memory cards 3.

A storage medium adapter 2 serves to allow the memory card 3 to be inserted into the computer 1 which is one example of an information processing apparatus. The storage medium adapter 2 also serves to convert data into a format which conforms to the PCMCIA standards.

If a user desires to cause the computer 1 to process or store data stored in the personal organizer 5, etc., the user inserts the memory card 3, which is an exclusive child storage medium, into the storage medium adapter 2, then inserts the storage medium adapter 2 into the storage medium holding part 1-1, and then starts to access the data.

An ejecting mechanism which constitutes a first embodiment of the present invention will be described below in detail with reference to FIGS. 4 to 9.

As shown in FIGS. 4 to 9, the computer 1 has the storage medium holding part 1-1 which conforms to the PCMCIA standards, as also shown in FIG. 3.

The storage medium adapter 2 has a connector portion 2-1 for connection to a connector portion 3-1 of the memory card 3 which is an exclusive child storage medium, and the connector portion 2-1 also serves to hold the memory card 3. The storage medium adapter 2 also has a connector portion 2-2 which conforms to the PCMCIA standards, and a locking cutout portion 2-3. The storage medium adapter 2 converts data and signals supplied from the memory card 3 into the PCMCIA format and outputs the PCMCIA data and signals through the connector portion 2-2, and also converts PCMCIA signals and data outputted from the computer 1 into a format which can be read into the memory card 3 which is an exclusive child storage medium.

A holding member 7 serves to hold the storage medium 4 called a PC card which conforms to the PCMCIA standards, and has a connector portion 7-1 which conforms to the PCMCIA standards. The holding member 7 also serves as a base for the ejecting mechanism according to the present invention.

An ejecting operating member 8 has an ejecting operating portion 8-2, a projection 8-3 for bringing a locking spring 12 into engagement with the locking cutout portion 2-3 for locking purpose, and a slot 8-1 via which the ejecting operating member 8 is connected to an arm 9 provided for ejecting the storage medium 4 or the storage medium adapter 2 which conforms to the PCMCIA standards.

The arm 9 has a hooking portion 9-1 for ejecting the storage medium 4 or the storage medium adapter 2 which conforms to the PCMCIA standards, and a shaft 9-3 via which the arm 9 is connected to the ejecting operating member 8. When the ejecting operating portion 8-2 is pressed in a direction in which to insert the storage medium 4 or the storage medium adapter 2 (hereinafter referred to as the insertion direction) to rotate the arm 9 about a pivot 9-2 via the end face of the slot 8-1, the hooking portion 9-1 hooks and ejects the storage medium 4 or the storage medium adapter 2. A spring 10 is provided for normally urging the ejecting operating member 8 in a direction in which to eject the storage medium adapter 2 or the storage medium 4 (hereinafter referred to as the ejection direction). A ring 11 is provided for preventing the ejecting operating member 8 from coming off.

The locking spring 12 has a locking portion 12-1 to engage with the locking cutout portion 2-3 of the storage medium adapter 2, and a curved portion 12-2 to be smoothly pressed by the projection 8-3 for bringing the locking spring 12 into engagement with the locking cutout portion 2-3 of the storage medium adapter 2 for locking purpose. The locking spring 12 has such an elasticity that if the curved portion 12-2 is not pressed by the projection 8-3, the locking portion 12-1 does not project inward from the position of the end face of the storage medium adapter 2 in which the locking cutout portion 2-3 is formed, as shown in FIG. 8. The locking spring 12 is connected to the ground (not shown) of the computer 1.

The operation of the ejecting mechanism having the above-described arrangement and the effects of the first embodiment of the present invention will be described below with reference to FIGS. 4 to 9.

If the storage medium adapter 2 is not inserted, the ejecting operating member 8 is urged by the spring 10 in the ejection direction, so that the projection 8-3 presses the curved portion 12-2 to cause the locking portion 12-1 to project inward from the position of the end face of the storage medium adapter 2 in which the locking cutout portion 2-3 is formed.

The user inserts the storage medium adapter 2 alone or the storage medium adapter 2 in which the memory card 3 is held, into the storage medium holding part 1-1 which conforms to the PCMCIA standards.

Figure 5:
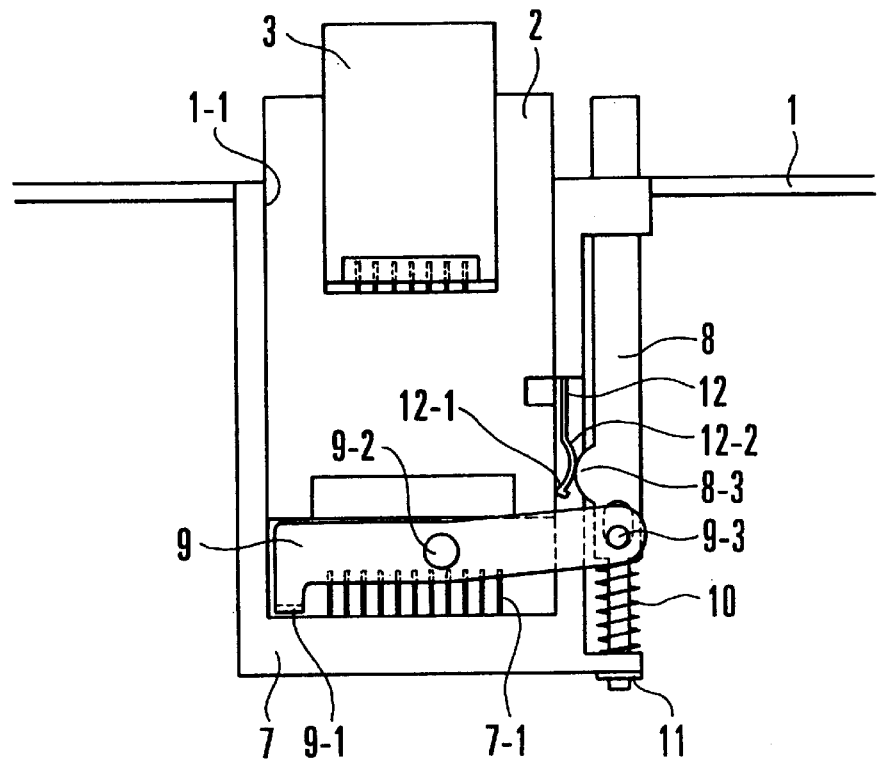
FIG. 5 is a detailed view of the ejecting mechanism according to the first embodiment.

At this time, as shown in FIG. 5, the storage medium adapter 2 is inserted in contact with the locking spring 12 for the purpose of ensuring grounding for preventing electrostatic destruction.

The locking spring 12 has a structure which assists the locking spring 12 to easily make contact with the storage medium adapter 2 as shown in FIG. 5, and the curved portion 12-2 is pressed by the projection 8-3. Accordingly, the locking spring 12 can securely ensure grounding and prevent occurrence of abrasion.

Figure 6:
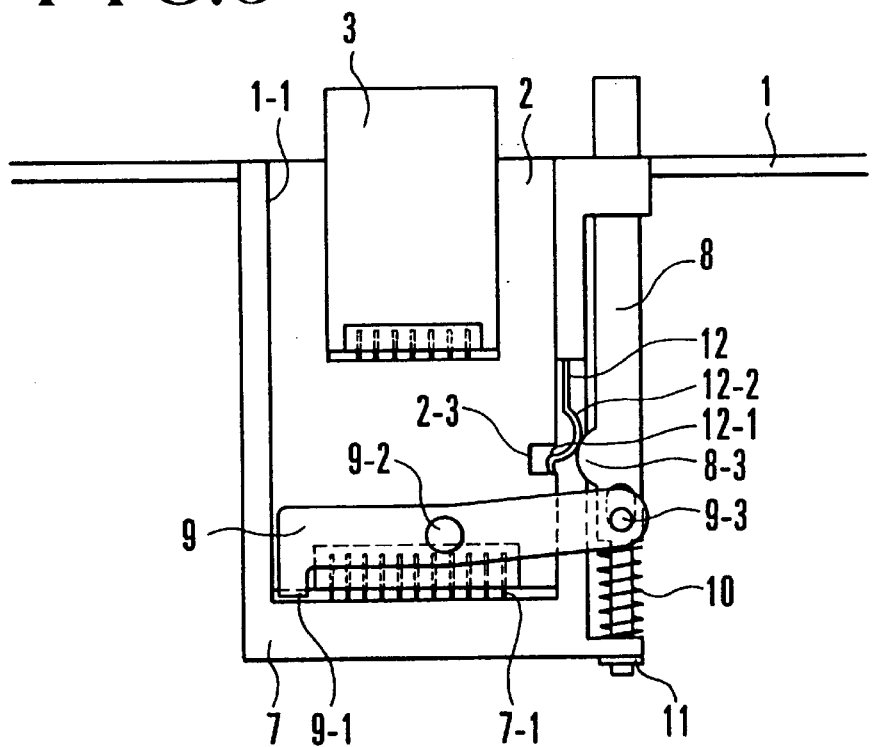
FIG. 6 is a detailed view of the ejecting mechanism according to the first embodiment.

When the storage medium adapter 2 is securely inserted to a position at which an electrical connection can be made between the connector portion 2-2 and the connector portion 7-1, the locking cutout portion 2-3 and the locking portion 12-1 engage with each other, thereby informing the user that the storage medium adapter 2 has been securely inserted (refer to FIG. 6).

In this state, the storage medium adapter 2 is locked to the computer 1.

If the user desires to replace only the memory card 3, the user can pull out only the memory card 3 (refer to FIG. 7) since the memory card 3 projects from the storage medium adapter 2.

A load, which is produced when the memory card 3 is pulled out, is not applied to the connector portion 2-2 or 7-1 since the locking portion 12-1 is engaged with the locking cutout portion 2-3.

The operation of ejecting the storage medium adapter 2 from the computer 1 will be described below with reference to FIGS. 8 and 9.

First of all, the user presses the ejecting operating portion 8-2 in the insertion direction against the load of the spring 10 which normally urges the ejecting operating member 8 in the ejection direction. Then, the ejecting operating member 8 slides in the insertion direction without applying load to the storage medium adapter 2 until the end face of the slot 8-1 makes contact with the shaft 9-3.

As shown in FIG. 8, the curved portion 12-2 is released from the state of being pressed by the projection 8-3 and the engagement between the locking cutout portion 2-3 and the locking portion 12-1 is released, whereby the storage medium adapter 2 is unlocked.

Figure 9:
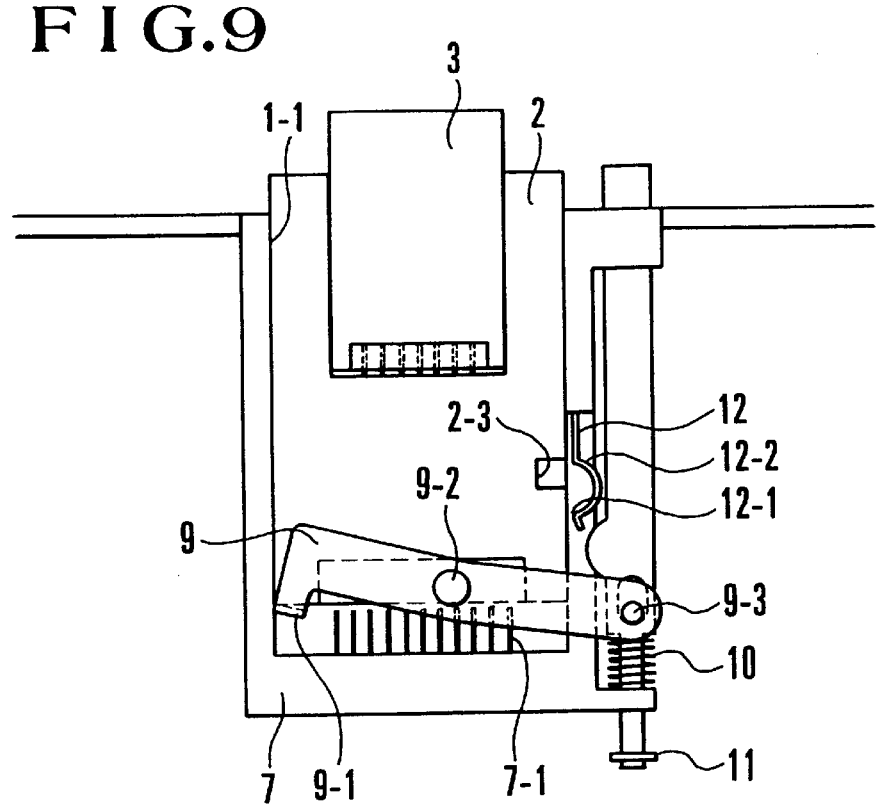
FIG. 9 is a detailed view of the ejecting mechanism according to the first embodiment.

When the ejecting operating member 8 is further pressed, the hooking portion 9-1 for ejecting the storage medium 4 or the storage medium adapter 2 rotates about the pivot 9-2, as shown in FIG. 9, and presses the storage medium adapter 2 in the ejection direction, whereby the storage medium adapter 2 is ejected.

As a matter of course, it is also possible to insert the PC card (storage medium) 4 without any problem, although it has no such cutout portion for engagement with the locking portion 12-1.

A second embodiment of the present invention will be described below with reference to FIGS. 10 and 11.

Figure 10:
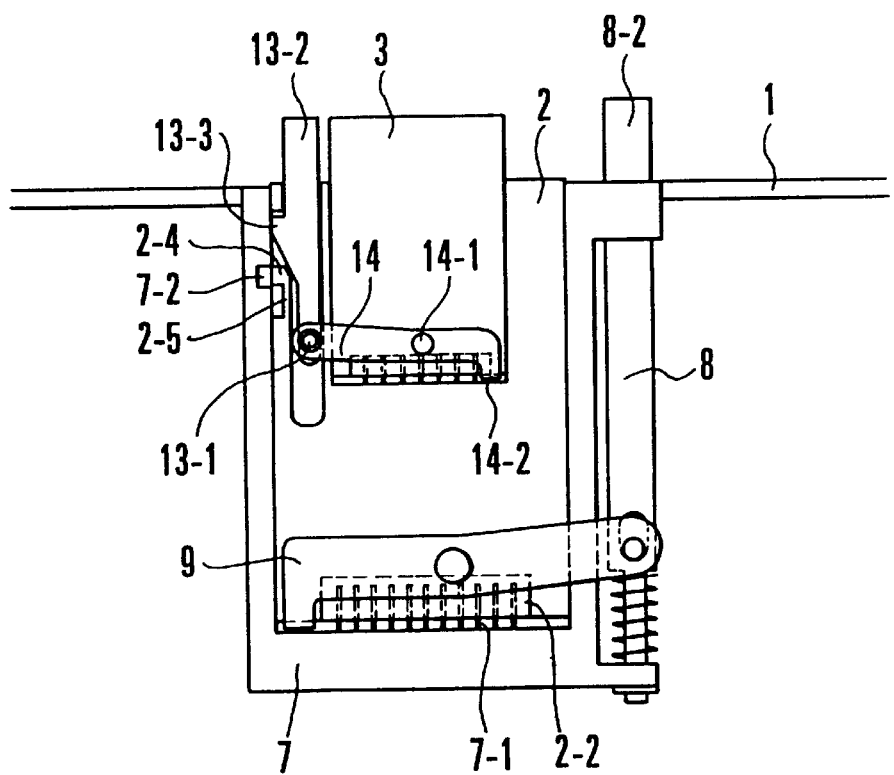
FIG. 10 is a schematic view showing a second embodiment of the present invention.
Figure 11:
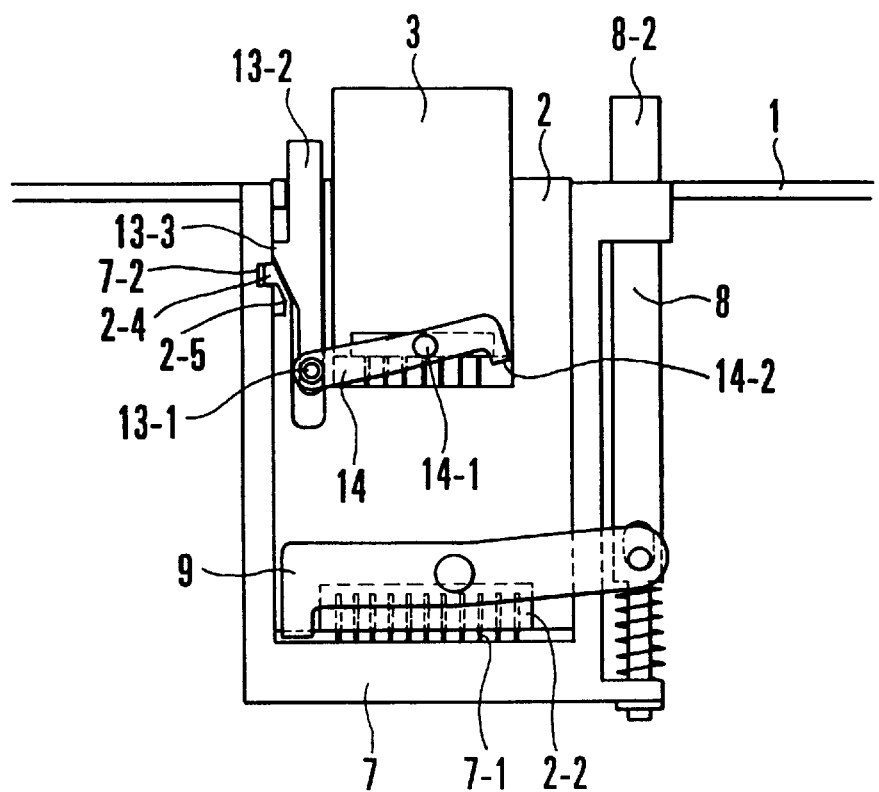
FIG. 11 is a schematic view showing the second embodiment.

In FIGS. 10 and 11, identical reference numerals are used to denote constituent elements which are functionally identical to those of the first embodiment. The second embodiment is arranged to eject the memory card 3 by using an ejecting mechanism instead of pulling out the memory card 3.

Referring to FIGS. 10 and 11, an ejecting operating member 13 has an ejecting operating portion 13-2, a tapered projection 13-3 for engaging a locking portion 2-4 with a locking cutout portion 7-2 provided in the holding member 7 and locking the storage medium adapter 2, and a hole portion 13-1 via which the ejecting operating member 13 is connected to an arm 14 for ejecting the exclusive, memory card 3.

The arm 14 has a hooking portion 14-2. When the ejecting operating portion 13-2 is pressed in the insertion direction to rotate the arm 14 about a pivot 14-1 via the hole portion 13-1, the hooking portion 14-2 ejects the memory card 3.

The storage medium adapter 2 also serves as a base for the above-described ejecting mechanism. The storage medium adapter 2 has the locking portion 2-4 which has elasticity owing to a thin portion 2-5. So far as the locking portion 2-4 is not pressed by the tapered projection 13-3, the locking portion 2-4 does not project outward from the adjacent end face of the storage medium adapter 2.

The operation of the ejecting mechanism having the above-described arrangement for ejecting a child storage medium and the effects of the second embodiment of the present invention will be described below with reference to FIGS. 10 and 11.

If the memory card 3 is inserted as shown in FIG. 10, the storage medium adapter 2 is not yet locked.

If the user presses the ejecting operating portion 13-2 to eject the memory card 3 as shown in FIG. 11, the tapered projection 13-3 engages the locking portion 2-4 with the locking cutout portion 7-2 provided in the holding member 7, thereby locking the storage medium adapter 2 to prevent load due to ejection from being applied to the connector portion 2-2 or 7-1.

To prevent the user from confusing the ejecting operating portions 13-2 and 8-2, the ejecting operating portions 13-2 and 8-2 are disposed in such a manner as to be opposed to each other across the memory card 3.

Figure 12:
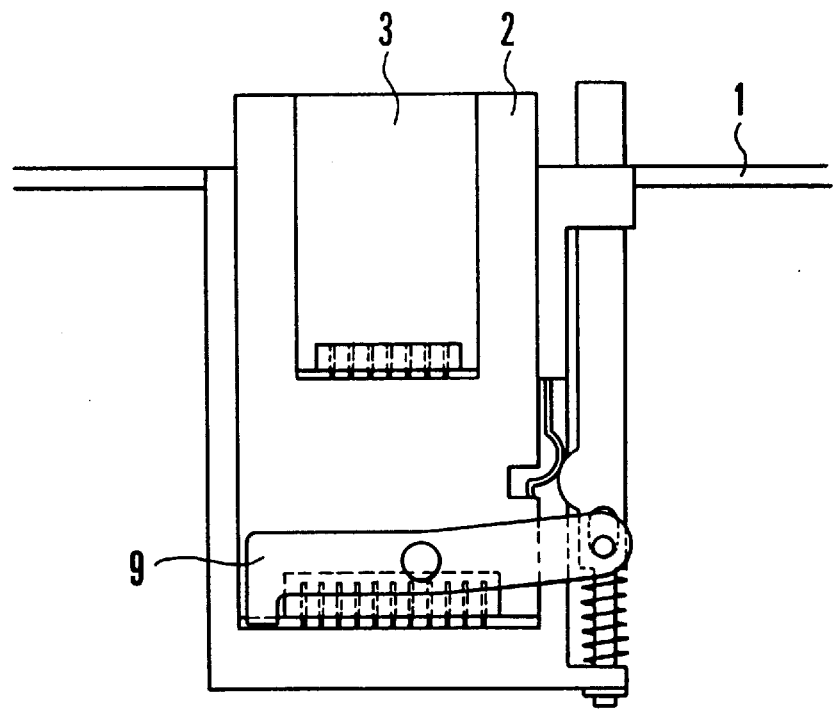
FIG. 12 is a schematic view showing a third embodiment of the present invention.

FIG. 12 shows a third embodiment of the present invention in which the child storage medium 3 is mounted in the storage medium adapter 2 in the state of not projecting from the front face of the storage medium adapter 2.

Although the first embodiment is arranged in such a manner that the user pulls out the child storage medium 3 at a position projecting from the front face of the storage medium adapter 2, the third embodiment is arranged so that the user can pull out the child storage medium 3 by projecting the storage medium adapter 2 from the computer 1.

With the above-described arrangement of the third embodiment, the user can mount or remove only the child storage medium 3 while protecting the child storage medium 3.

In the conventional example, after data stored in a first child storage medium has been read into an information processing apparatus, if data stored in a second child storage medium is to be read into the information processing apparatus, users need to temporarily remove a storage medium adapter from the information processing apparatus, mount the second child storage medium in the storage medium adapter in place of the first child storage medium, and insert the storage medium adapter into the information processing apparatus. However, in accordance with the above-described first to third embodiments, it is possible to eliminate such an awkward operation and improve the operability of the information processing apparatus.

In addition, it is possible to solve the problem that the reliability of the connector of the information processing apparatus is impaired by an unnecessary repetition of mounting or removable of the storage medium adapter in or from the connector of the information processing apparatus.

In addition, in the case of the arrangement which allows the child storage medium to be removed from the storage medium adapter without removing the storage medium adapter from the information processing apparatus, it is possible to eliminate the risk that load, such as twisting force, may be applied to and cause damage to the connector of the information processing apparatus due to the absence of a lock mechanism.

In addition, it is possible to retain the reliability of the electrical connection between the connector of the information processing apparatus and the child storage medium.

According to the first to third embodiments, it is possible to liberate users from the aforesaid awkward operation.

According to the first to third embodiments, it is possible to prevent unnecessary stress, such as twisting force, from being applied to the connector of the information processing apparatus when the child storage medium is removed from the storage medium adapter without removing the storage medium adapter from the information processing apparatus. In addition, it is possible to solve the problem of lowering the reliability of the electrical connection between the connector of the information processing apparatus and the child storage medium.

According to the first to third embodiments, it is possible to remove the storage medium adapter together with the child storage medium from the information processing apparatus without releasing the locking mechanism.

According to the first and second embodiments, it is possible to prevent users from confusing the operation of ejecting the child storage medium and the operation of removing the storage medium adapter.

According to the first embodiment, it is possible to realize removal of the child storage medium without providing the storage medium adapter with a mechanism for ejecting the child storage medium.

According to the third embodiment, it is possible to realize removal of the child storage medium without providing the storage medium adapter with a mechanism for ejecting the child storage medium.

Figure 13:
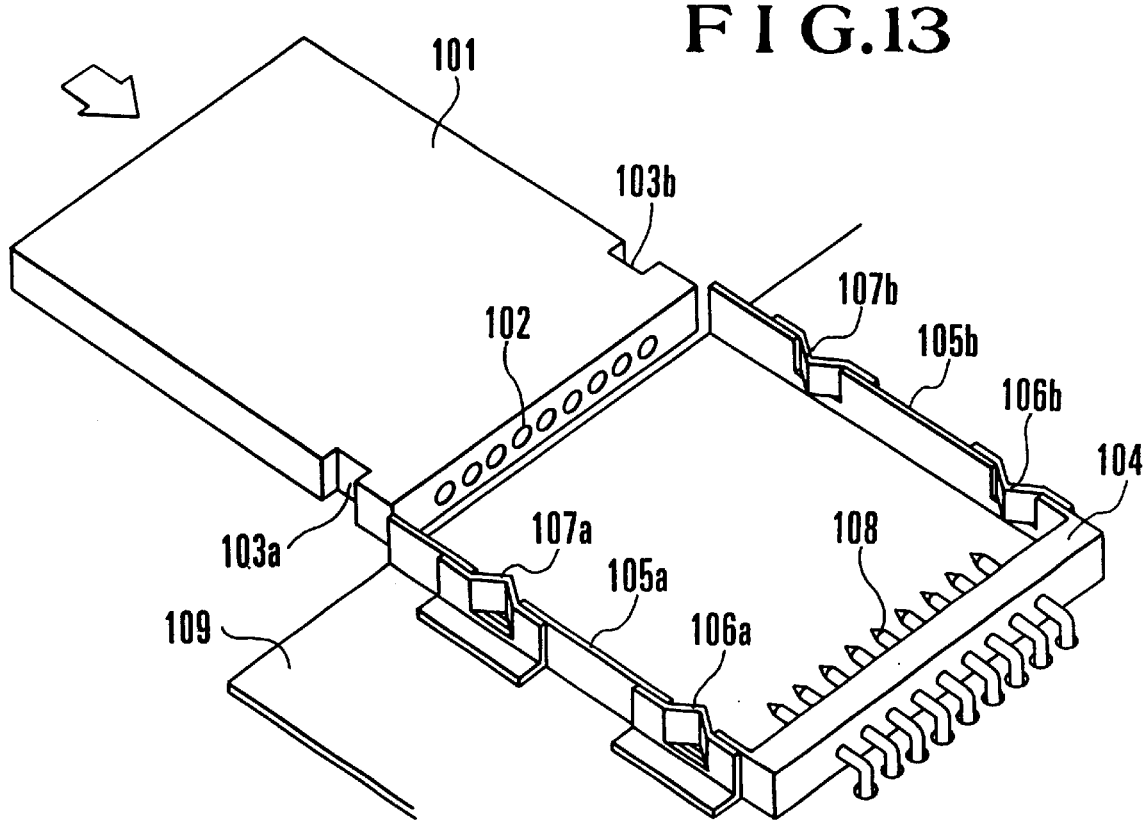
FIG. 13 is a schematic, perspective view showing a fourth embodiment of the present invention.
Figure 14:
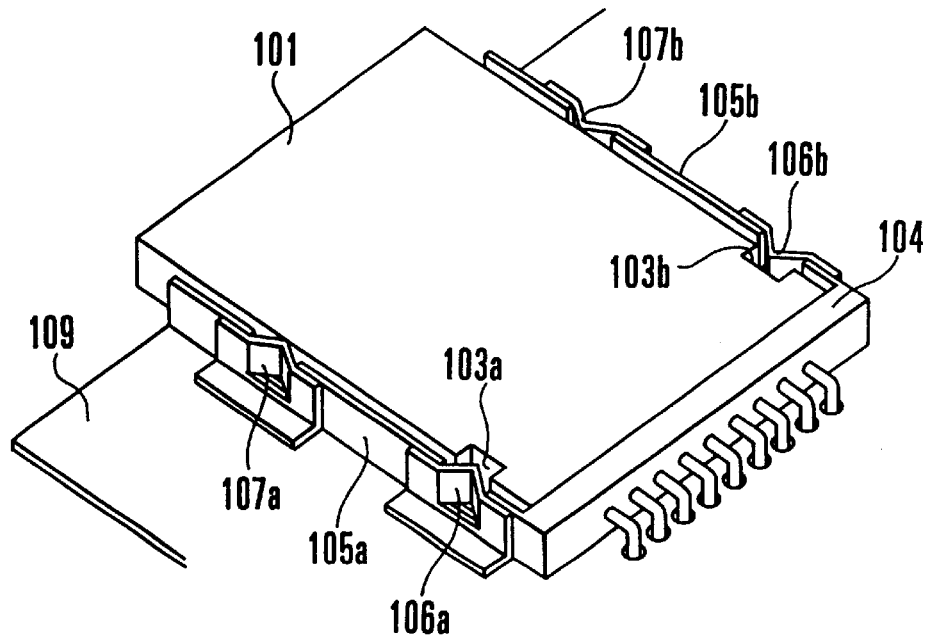
FIG. 14 is a schematic, perspective view showing a state in which a card-shaped storage medium is used.
Figure 15:
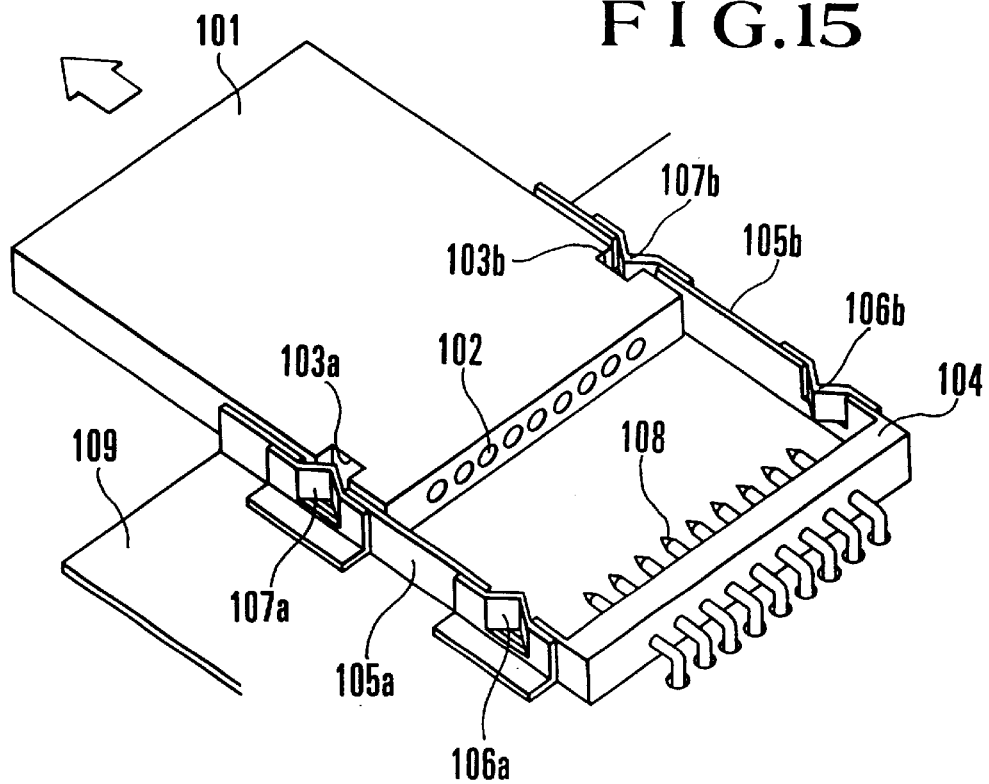
FIG. 15 is a schematic, perspective view showing a state in which the card-shaped storage medium is being ejected.

FIG. 13 is a perspective view showing a fourth embodiment of the present invention. As shown in FIG. 13, a card-shaped storage medium 101, which has a storage medium in its inside, includes an electrode terminal portion 102, and recesses 103a and 103b externally formed in the opposite sides of the card-shaped storage medium 101. The information processing apparatus (part of which is shown) includes a connector 104 for the card-shaped storage medium 101, which is provided in the inside of the information processing apparatus using the card-shaped storage medium 101, guide portions 105a and 105b provided on the connector 104, members 106a and 106b which respectively form projections at opposite locations selected to correspond to the recesses 103a and 103b of the card-shaped storage medium 101 during the use thereof, members 107a and 107b which respectively form projections at opposite locations selected to correspond to the recesses 103a and 103b of the card-shaped storage medium 101 when the card-shaped storage medium 101 reaches an intermediate position during the ejection thereof, an electrode terminal portion 108, and a printed circuit board 109 on which the connector 104 is mounted and which is incorporated in the information processing apparatus. When a user is to use the card-shaped storage medium 101, the user inserts the card-shaped storage medium 101 along the guide portions 105a and 105b of the connector 104 in the direction of the shown arrow and connects the electrode terminal portions 102 and 108 to each other. FIG. 14 shows the state in which the card-shaped storage medium 101 is electrically connected to the connector 104, i.e., the state in which the card-shaped storage medium 101 is in use. As shown in FIG. 14, during the use of the card-shaped storage medium 101, the recesses 103a and 103b formed in the card-shaped storage medium 101 are respectively fitted into and lightly fastened by the projections 106a and 106b provided on the guide portions 105a and 105b. After the use of the card-shaped storage medium 101, the user ejects the card-shaped storage medium 101 along the guide portions 105a and 105b of the connector 104 in the direction opposite to that of the arrow shown in FIG. 13. During the ejection of the card-shaped storage medium 101, when the card-shaped storage medium 101 reaches a particular intermediate position, the recesses 103a and 103b formed in the card-shaped storage medium 101 are respectively fitted into and lightly fastened by the projections 107a and 107b provided in the guide portions 105a and 105b, as shown in FIG. 15.

As is apparent from the above description, during the use of the card-shaped storage medium 101, if the user is to accidentally eject the card-shaped storage medium 101 from the information processing apparatus or a vibration or the like is applied to the information processing apparatus, the card-shaped storage medium 101 is prevented from easily coming off from the information processing apparatus. In addition, even if the user takes his/her hand off the card-shaped storage medium 101 while the card-shaped storage medium 101 is being ejected from the connector 104, the card-shaped storage medium 101 is lightly fastened by the connector 104, i.e., the projections 107a and 107b, whereby the card-shaped storage medium 101 is prevented from dropping and being damaged. In addition, since the projections 106a, 106b and 107a, 107b are formed on the guide portions 105a and 105b and the recesses 103a and 103b are formed in the opposite sides of the card-shaped storage medium 101, when the card-shaped storage medium 101 is completely connected to the connector 104 or while the card-shaped storage medium 101 is being ejected from the information processing apparatus, the projections 106a, 106b or 107a, 107b are fitted into the recesses 103a and 103b, whereby the operator can obtain a distinct click touch.

Figure 16:
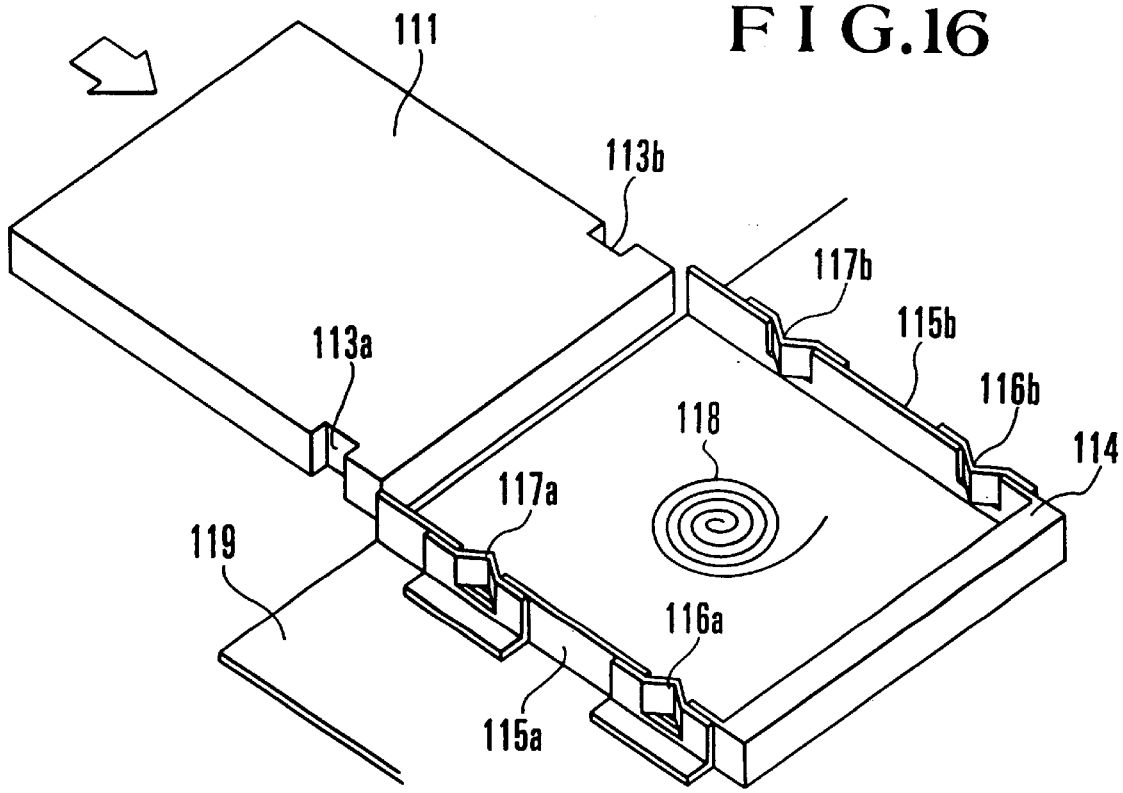
FIG. 16 is a schematic, perspective view showing one example of non-contact connection.

Although in the fourth embodiment (and the following embodiments) the electrode terminal portion 102 and the electrode terminal portion 108 are connected by fitting the female metallic terminals of the electrode terminal portion 102 onto the respective male metallic terminals of the electrode terminal portion 108, it is also possible to adopt other connection methods, such as non-contact connection using light or magnetism. One example of the non-contact connection method is shown in FIG. 16. As shown in FIG. 16, a card-shaped storage medium 111, which has a storage medium in its inside, includes recesses 113a and 113b externally formed in opposite sides of the card-shaped storage medium 111. The information processing apparatus (part of which is shown) includes a holder 114 for the card-shaped storage medium 111, which is provided in the inside of the information processing apparatus employing the card-shaped storage medium 111, guide portions 115a and 115b provided on the holder 114, members 116a and 116b which respectively form projections at opposite locations selected to corresponds to the recesses 113a and 113b of the card-shaped storage medium 111 during the use thereof, members 117a and 117b which respectively form projections at opposite locations selected to correspond to the recesses 113a and 113b of the card-shaped storage medium 111 when the card-shaped storage medium 111 reaches an intermediate position during the ejection thereof, a printed circuit board 119 on which the holder 114 is mounted and which is incorporated in the information processing apparatus, and a seat coil 118 which is formed on the printed circuit board 119 as a conductor pattern. A seat coil (not shown) is formed in the inside of the card-shaped storage medium 111 at a location selected to correspond to the seat coil 118 during the use of the card-shaped storage medium 111, and the card-shaped storage medium 111 and the information processing apparatus are connected by electromagnetic coupling. In this case, since the card-shaped storage medium 111 is not mechanically held at such connection portion, the fastening method according to the present invention is extremely effective.

Figure 17:
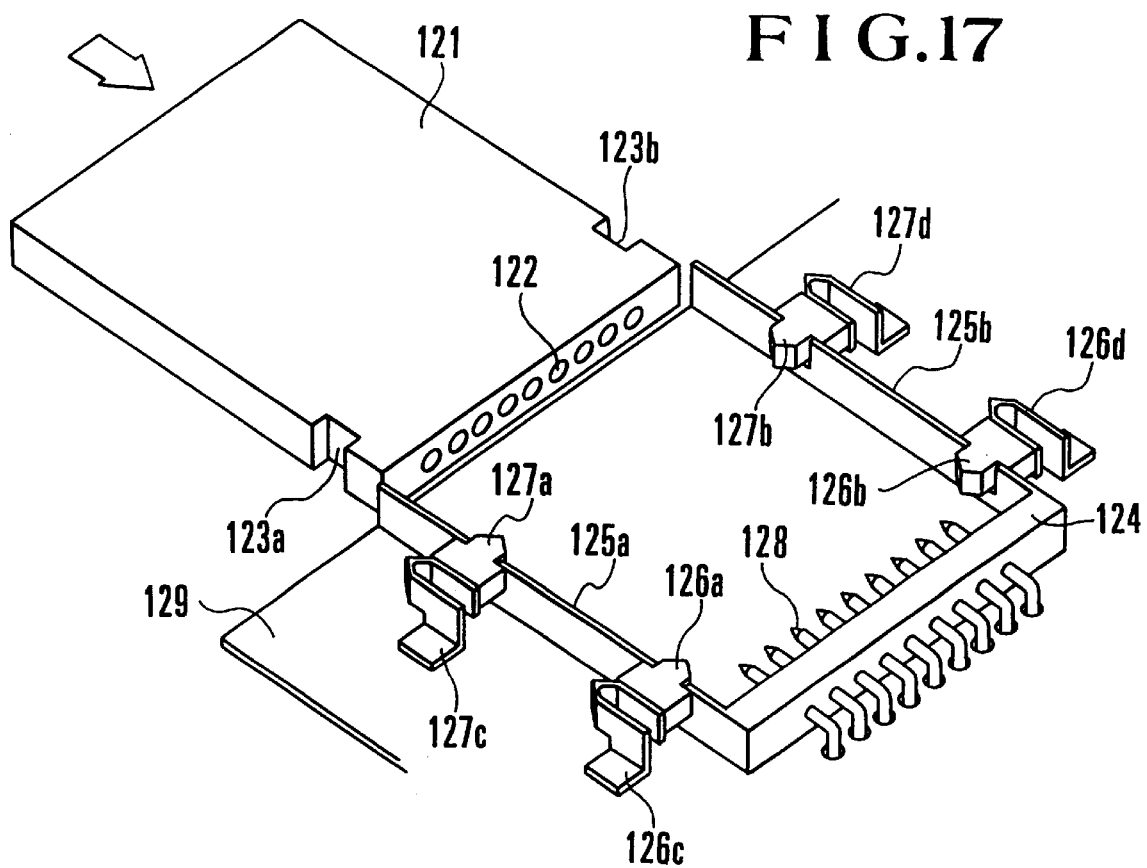
FIG. 17 is a schematic, perspective view showing an example in which projections are formed of elastic material.

The aforesaid projections may not have elasticity, and the arrangement shown in FIG. 17 may be adopted. As shown in FIG. 17, a card-shaped storage medium 121, which has a storage medium in its inside, includes an electrode terminal portion 122, and recesses 123a and 123b externally formed in the opposite sides of the card-shaped storage medium 121. The information processing apparatus (part of which is shown) includes a connector 124 for the card-shaped storage medium 121, which is provided in the inside of the information processing apparatus using the card-shaped storage medium 121, guide portions 125a and 125b provided on the connector 124, members 126a and 126b which respectively form projections at opposite locations selected to correspond to the recesses 123a and 123b of the card-shaped storage medium 121 during the use thereof, elastic members 126c and 126d for holding the members 126a and 126b, members 127a and 127b which respectively form projections at opposite locations selected to correspond to the recesses 123a and 123b of the card-shaped storage medium 121 when the card-shaped storage medium 121 reaches an intermediate position during the ejection thereof, elastic members 127c and 127d for holding the members 127a and 127b, an electrode terminal portion 128 of the connector 124, and a printed circuit board 129 on which the connector 124 is mounted and which is incorporated in the information processing apparatus.

Figure 18:
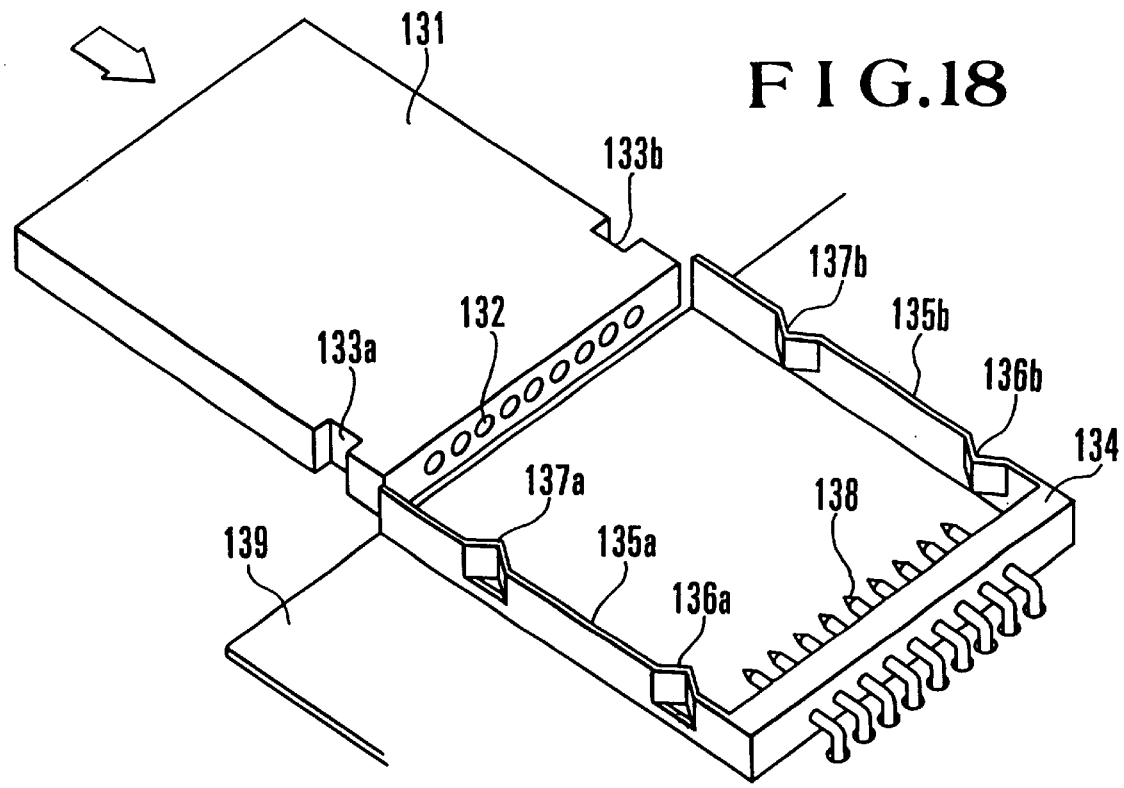
FIG. 18 is a schematic, perspective view showing an example in which projections and guides are integrally formed.

As shown in FIG. 13, the projections 106a and 106b and the projections 107a and 107b are prepared as members independent of the guide portions 105a and 105b. However, as shown in FIG. 18, part of guide portions 135a and 135b may be formed into projections 136a, 137a and 136b, 137b, respectively. In this case, since the guide portions 135a and 135b and the projections 136a, 137a and 136b, 137b can be integrally formed, component costs and manufacturing costs can be reduced.

In addition, the projections 106a, 106b and 107a, 107b of the guide portions 105a and 105b may be formed of material having electrical conductivity, such as metal or electrically conductive rubber, so that they can be utilized as grounding terminals and/or power source terminals. The projections 106a, 106b and 107a, 107b may also be formed to conduct electricity thereamong within the information processing apparatus, whereby the card-shaped storage medium 101 can check the state of their electrical conduction and detect whether the card-shaped storage medium 101 has been connected to the connector 104.

In the fourth embodiment (and the following embodiments), the aforesaid projections and recesses are provided symmetrically with respect to the direction of insertion of the card-shaped storage medium. However, even if the projections and the recesses are provided asymmetrically or on either side with respect to the insertion direction, similar effects can be obtained.

In addition, temporarily fastening means may be respectively provided only at opposite locations selected to correspond to recesses formed in opposite sides of a card-shaped storage medium, during the use thereof, or only at opposite locations selected to correspond to recesses formed in opposite sides of a card-shaped storage medium, when the card-shaped storage medium reaches an intermediate position during the ejection thereof.

Figure 19:
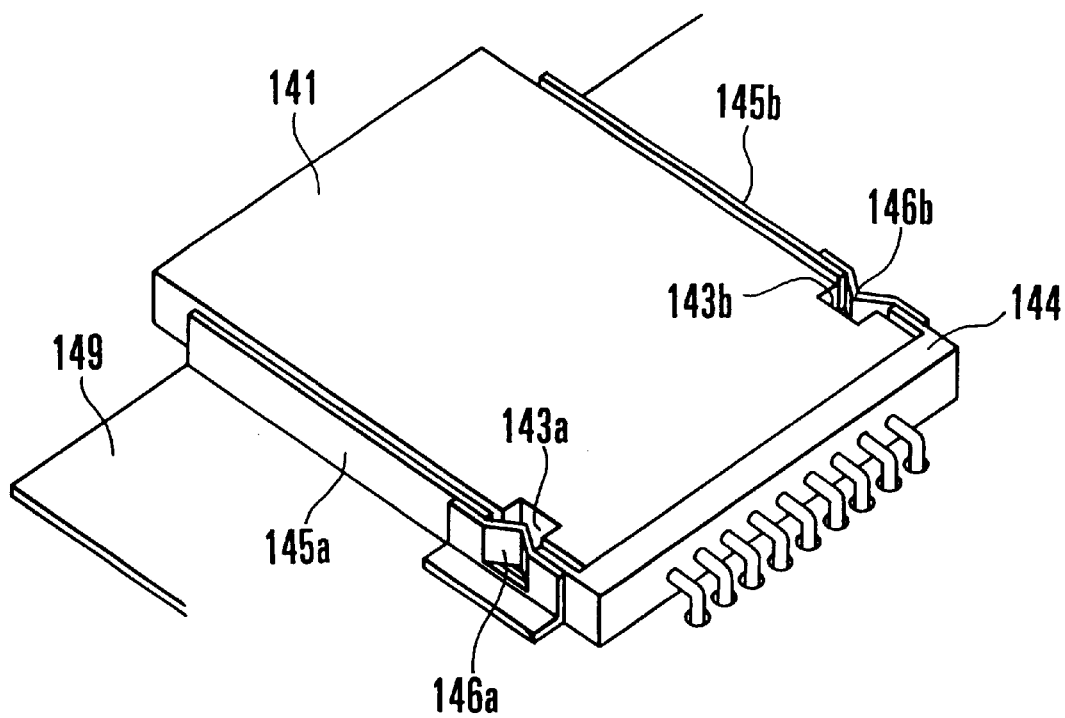
FIG. 19 is a schematic, perspective view showing an example in which temporarily fastening means are provided only at locations respectively selected to correspond to recesses formed in a card-shaped storage medium, during the use thereof.

FIG. 19 is a perspective view showing an example in which temporarily fastening means are respectively provided only at opposite locations selected to correspond to recesses formed in opposite sides of a card-shaped storage medium, during the use thereof. Referring to FIG. 19, a card-shaped storage medium 141, which has a storage medium in its inside, includes recesses 143a and 143b externally formed in opposite sides of the card-shaped storage medium 141. The information processing apparatus (part of which is shown) includes a connector 144 for the card-shaped storage medium 141, which is provided in the inside of the information processing apparatus employing the card-shaped storage medium 141, guide portions 145a and 145b provided on the connector 144, members 146a and 146b which respectively form projections at opposite locations selected to corresponds to the recesses 143a and 143b of the card-shaped storage medium 141 during the use thereof, and a printed circuit board 149 on which the connector 144 is mounted and which is incorporated in the information processing apparatus. According to this arrangement, during the use of the card-shaped storage medium 141, if the user is to accidentally eject the card-shaped storage medium 141 from the information processing apparatus or a vibration or the like is applied to the information processing apparatus, the card-shaped storage medium 141 is prevented from easily coming off from the information processing apparatus. In addition, since the projections 146a and 146b are formed on the guide portions 145a and 145b and the recesses 143a and 143b are formed in the opposite sides of the card-shaped storage medium 141, when the card-shaped storage medium 141 is completely connected to the connector 144 or while the card-shaped storage medium 141 is being ejected from the information processing apparatus, the projections 146a and 146b are fitted into the recesses 143a and 143b, whereby the operator can obtain a distinct click touch.

Figure 20:
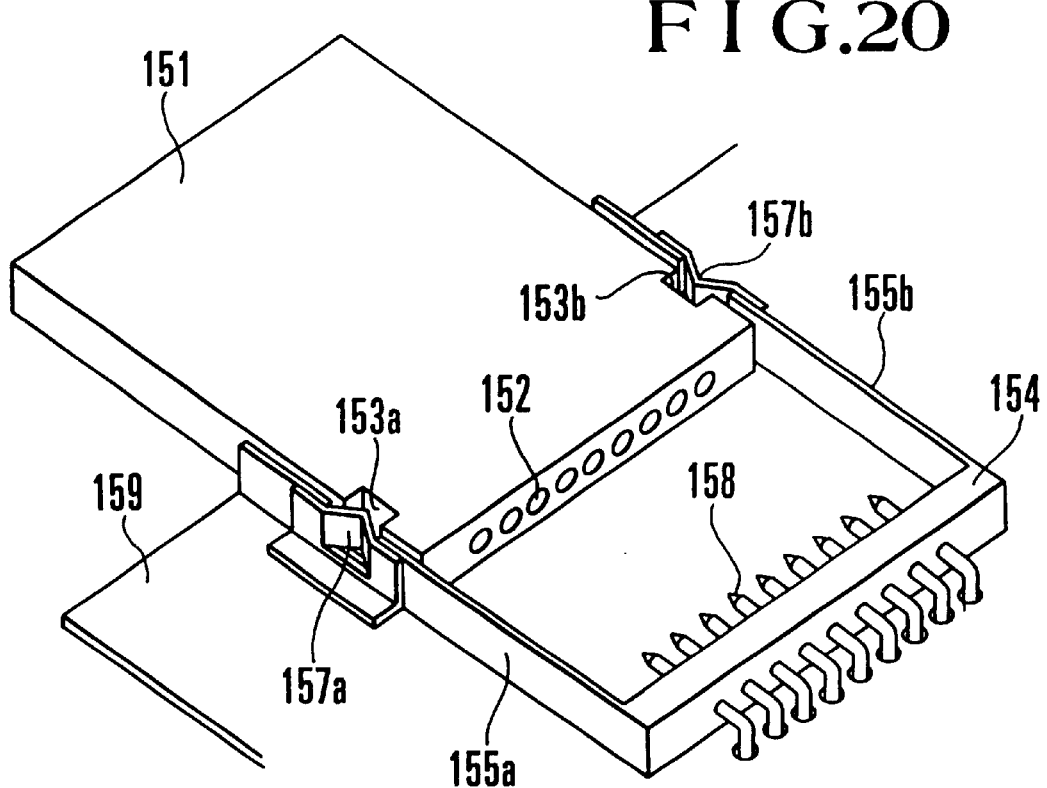
FIG. 20 is a schematic, perspective view showing an example in which temporarily fastening means are provided only at locations respectively selected to correspond to recesses formed in a card-shaped storage medium, when the card-shaped storage medium reaches an intermediate position while it is being ejected.

FIG. 20 is a perspective view showing an example in which temporarily fastening means are respectively provided only at opposite locations selected to correspond to recesses formed in opposite sides of a card-shaped storage medium, when the card-shaped storage medium reaches an intermediate position during the ejection thereof. Referring to FIG. 20, a card-shaped storage medium 151, which has a storage medium in its inside, includes an electrode terminal portion 152, recesses 153a and 153b externally formed in opposite sides of the card-shaped storage medium 151. The information processing apparatus (part of which is shown) includes a connector 154 for the card-shaped storage medium 151, which is provided in the inside of the information processing apparatus employing the card-shaped storage medium 151, guide portions 155a and 155b provided on the connector 154, members 157a and 157b which respectively form projections at opposite locations selected to corresponds to the recesses 153a and 153b of the card-shaped storage medium 151 when the card-shaped storage medium 151 reaches an intermediate position during the ejection thereof, an electrode terminal portion 158 of the connector 154, and a printed circuit board 159 on which the connector 154 is mounted and which is incorporated in the information processing apparatus. According to this arrangement, even if the user takes his/her hand off the card-shaped storage medium 151 while the card-shaped storage medium 151 is being ejected from the connector 154, the card-shaped storage medium 151 is lightly fastened by the connector 154, i.e., the projections 157a and 157b, whereby the card-shaped storage medium 151 is prevented from dropping and being damaged.

Figure 21:
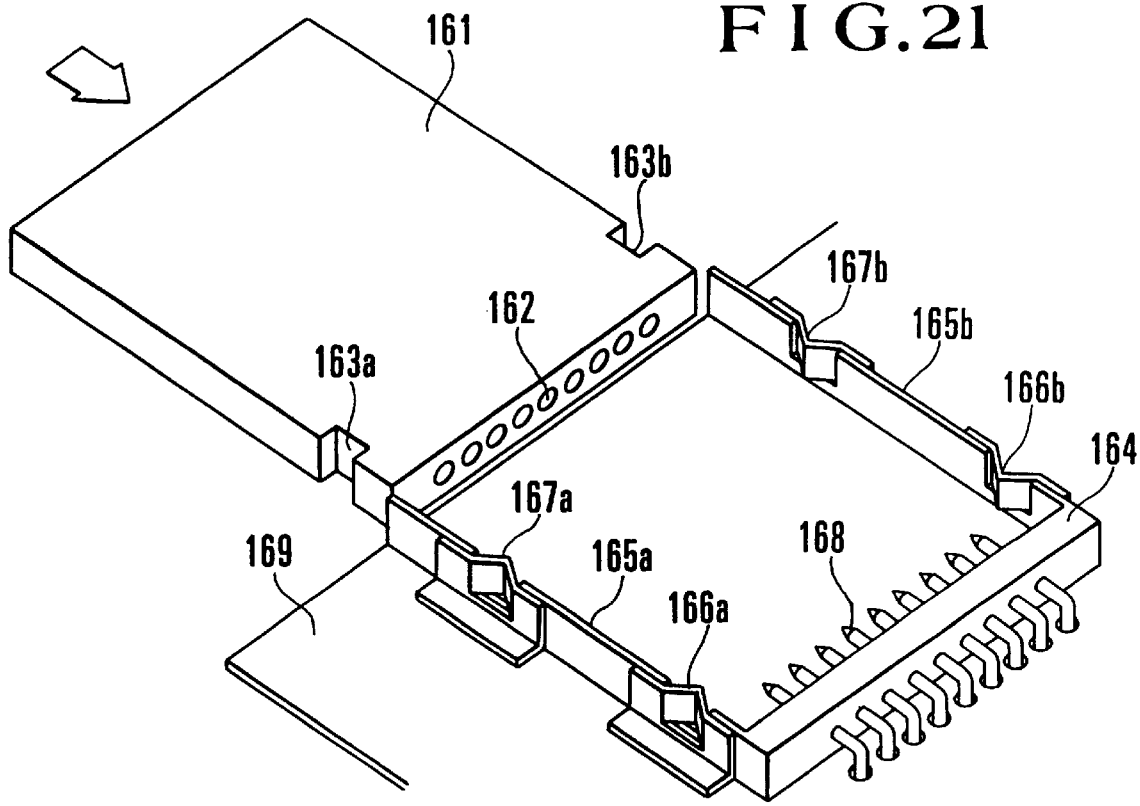
FIG. 21 is a schematic, perspective view showing a fifth embodiment of the present invention.

FIG. 21 is a perspective view showing a fifth embodiment of the present invention. As shown in FIG. 21, a card-shaped storage medium 161, which has a storage medium in its inside, includes an electrode terminal portion 162 and recesses 163a and 163b externally formed in the opposite sides of the card-shaped storage medium 161. The information processing apparatus (part of which is shown) includes a connector 164 for the card-shaped storage medium 161, which is provided in the inside of the information processing apparatus using the card-shaped storage medium 161, guide portions 165a and 165b provided on the connector 164, members 166a and 166b which respectively form projections at opposite locations selected to correspond to the recesses 163a and 163b of the card-shaped storage medium 161 during the use thereof, members 167a and 167b which respectively form projections at opposite locations selected to correspond to the recesses 163a and 163b of the card-shaped storage medium 161 when the card-shaped storage medium 161 reaches an intermediate position during the ejection thereof, an electrode terminal portion 168, and a printed circuit board 169 on which the connector 164 is mounted and which is incorporated in the information processing apparatus. In the fifth embodiment, the projections 166a, 166b and the projections 167a, 167b are formed to differ from each other in elasticity. Specifically, the temporary fastening force of the projections 166a and 166b onto which the respective recesses 163a and 163b of the card-shaped storage medium 161 are to be fitted during the use of the card-shaped storage medium 161 is selected to be stronger than the temporary fastening force of the projections 167a and 167b onto which the respective recesses 163a and 163b of the card-shaped storage medium 161 are fitted when the card-shaped storage medium 161 reaches an intermediate position during the ejection thereof. Accordingly, during the use of the card-shaped storage medium 161, the card-shaped storage medium 161 is comparatively strongly fastened so that it can be prevented from easily coming off from the connector 154 owing to a vibration or the like occurring in the information processing apparatus. During the ejection of the card-shaped storage medium 161, the card-shaped storage medium 161 is lightly fastened so that it can be easily ejected from the information processing apparatus.

Figure 22:
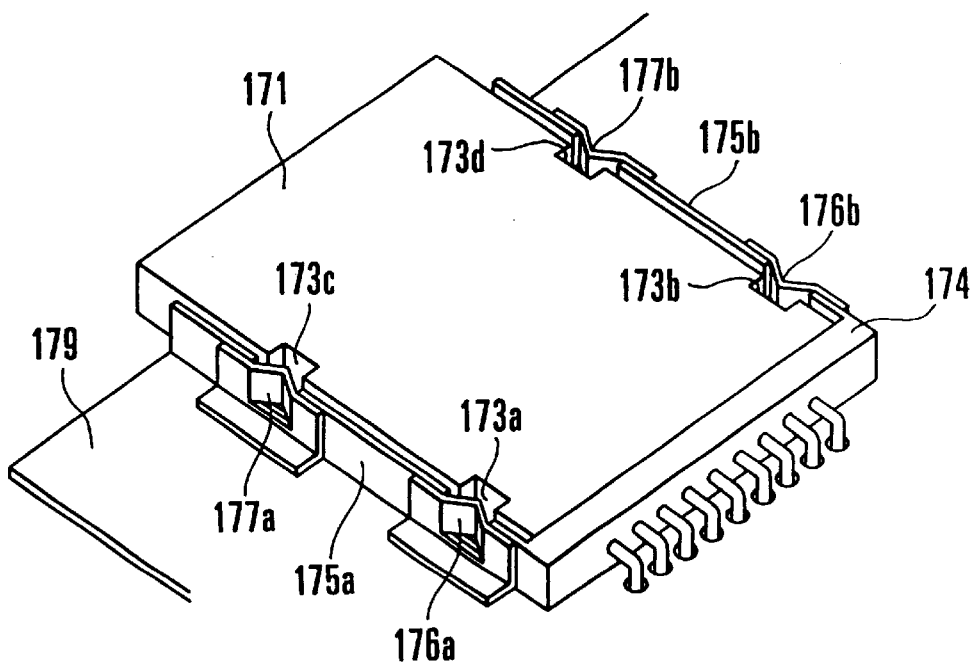
FIG. 22 is a schematic, perspective view showing an example provided with a plurality of recesses.

Similar effects can be obtained by forming, as shown in FIG. 22, a larger number of recesses in opposite sides of a card-shaped storage medium without making the projections formed in the guide portions different in elasticity. As shown in FIG. 22, a card-shaped storage medium 171, which has a storage medium in its inside, includes recesses 173a, 173b, 173c and 173d externally formed in the opposite sides of the card-shaped storage medium 171. The information processing apparatus (part of which is shown) includes a connector 174 for the card-shaped storage medium 171, which is provided in the inside of the information processing apparatus using the card-shaped storage medium 171, guide portions 175a and 175b provided on the connector 174, members 176a and 176b which respectively form projections at opposite locations selected to correspond to the recesses 173a and 173b of the card-shaped storage medium 171 during the use thereof, members 177a and 177b which respectively form projections at opposite locations selected to correspond to the recesses 173a and 173b of the card-shaped storage medium 171 when the card-shaped storage medium 171 reaches an intermediate position during the ejection thereof, and a printed circuit board 179 on which the connector 174 is mounted and which is incorporated in the information processing apparatus. In this arrangement, during the use of the card-shaped storage medium 171, the card-shaped storage medium 171 is fastened at four positions in such a manner that the recesses 173a, 173b, 173c and 173d are respectively fitted onto the projections 176a, 176b, 177a and 177b. Although not shown, the card-shaped storage medium 171, which has reached an intermediate position during the ejection thereof, is fastened at two positions in such a manner that only the recesses 173a and 173b are fitted onto the respective projections 177a and 177b. Accordingly, during the use of the card-shaped storage medium 171, the card-shaped storage medium 171 is comparatively strongly fastened to the information processing apparatus similarly to the above-described arrangement, so that the card-shaped storage medium 171 can be prevented from easily coming off from the connector 174 owing to a vibration or the like occurring in the information processing apparatus. During the ejection of the card-shaped storage medium 171, the card-shaped storage medium 171 is lightly fastened so that it can be easily ejected from the information processing apparatus.

Figure 23A:
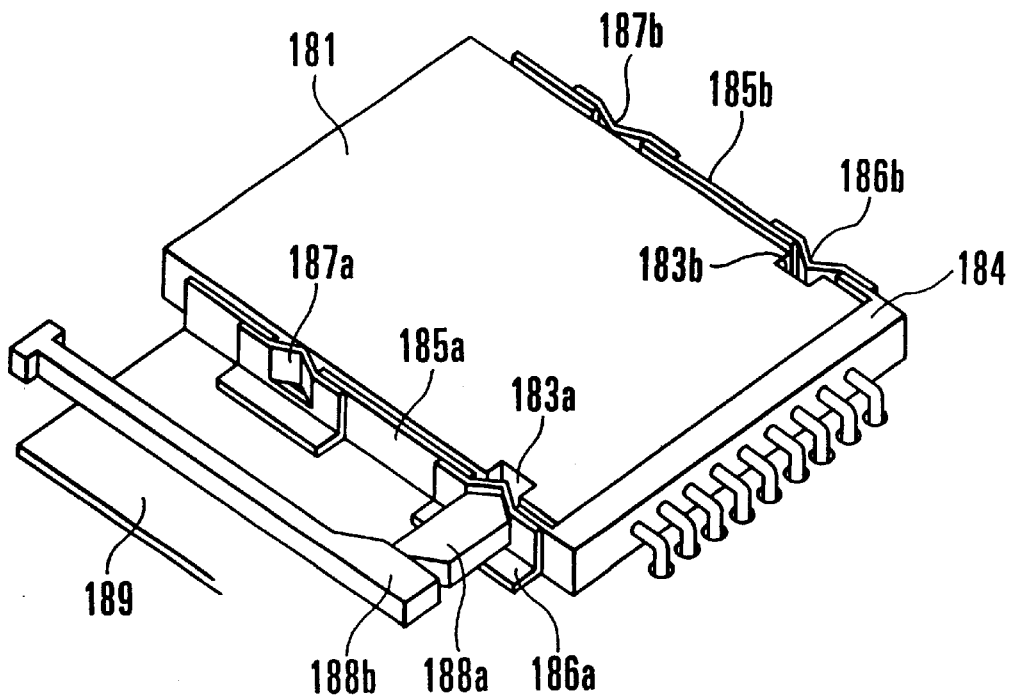
FIGS. 23(a) and 23(b) are schematic, perspective views showing a sixth embodiment of the present invention.
Figure 23B:
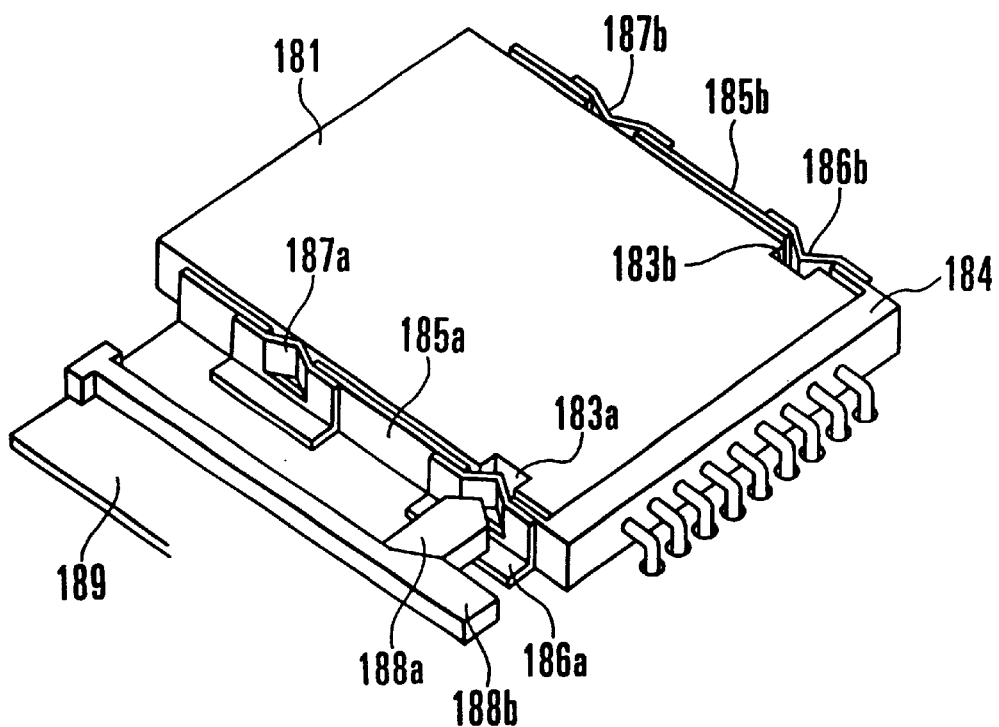

FIGS. 23(a) and 23(b) are perspective views showing a sixth embodiment of the present invention. As shown in FIGS. 23(a) and 23(b), a card-shaped storage medium 181, which has a storage medium in its inside, includes recesses 183a and 183b externally formed in the opposite sides of the card-shaped storage medium 181. The information processing apparatus (part of which is shown) includes a connector 184 for the card-shaped storage medium 181, which is provided in the inside of the information processing apparatus using the card-shaped storage medium 181, guide portions 185a and 185b provided on the connector 184, members 186a and 186b which respectively form projections at opposite locations selected to correspond to the recesses 183a and 183b of the card-shaped storage medium 181 during the use thereof, members 187a and 187b which respectively form projections at opposite locations selected to correspond to the recesses 183a and 183b of the card-shaped storage medium 181 when the card-shaped storage medium 181 reaches an intermediate position during the ejection thereof, a locking member 188a for preventing elastic deformation of the projection 186a, a lever 188b provided for changing the state of the locking member 188a (between locked and unlocked states), and a printed circuit board 189 on which the connector 184 is mounted and which is incorporated in the information processing apparatus. The lever 188b locks the locking member 188a if pulled as shown in FIG. 23(a), whereas the lever 188b unlocks the locking member 188a if depressed as shown in FIG. 23(b). By locking the locking member 188a during the use of the card-shaped storage medium 181, the card-shaped storage medium 181 is securely fastened to the information processing apparatus. Accordingly, if the user is to accidentally eject the card-shaped storage medium 181 from the information processing apparatus or a vibration or the like is applied to the information processing apparatus, the card-shaped storage medium 181 is prevented from easily coming off from the information processing apparatus.

Figure 24:
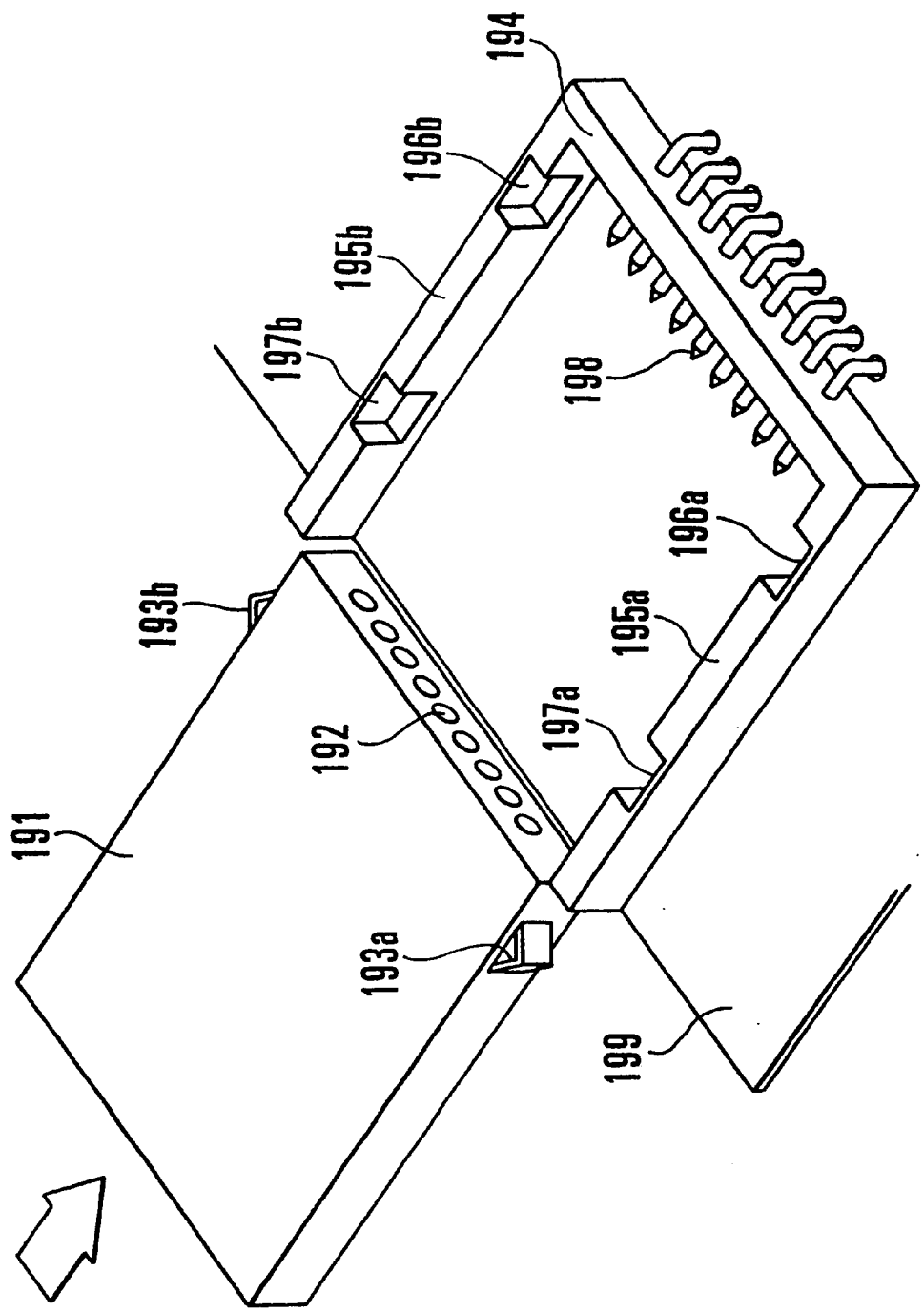
FIG. 24 is a schematic, perspective view showing a seventh embodiment of the present invention.

FIG. 24 is a perspective view showing a seventh embodiment of the present invention. As shown in FIG. 24, a card-shaped storage medium 191, which has a storage medium in its inside, includes an electrode terminal portion 192, and projections 193a and 193b externally formed in the opposite sides of the card-shaped storage medium 191. The information processing apparatus (part of which is shown) includes a connector 194 for the card-shaped storage medium 191, which is provided in the inside of the information processing apparatus using the card-shaped storage medium 191, guide portions 195a and 195b provided on the connector 194, portions 196a and 196b which respectively form recesses at opposite locations selected to correspond to the projections 193a and 193b of the card-shaped storage medium 191 during the use thereof, portions 197a and 197b which respectively form recesses at opposite locations selected to correspond to the projections 193a and 193b of the card-shaped storage medium 191 when the card-shaped storage medium 191 reaches an intermediate position during the ejection thereof, an electrode terminal portion 198 of the connector 194, and a printed circuit board 199 on which the connector 194 is mounted and which is incorporated in the information processing apparatus. When the user is to use the card-shaped storage medium 191, the user inserts the card-shaped storage medium 191 along the guide portions 195a and 195b of the connector 194 in the direction of the shown arrow and connects the electrode terminal portions 192 and 198 to each other. Since the projections 193a and 193b are formed on the card-shaped storage medium 191, only the projections 193a and 193b of the card-shaped storage medium 191 make frictional contact with the respective guide portions 195a and 195b during insertion or ejection, so that the exterior faces of the card-shaped storage medium 191 are prevented from being scratched, except for the projections 193a and 193b.

The projections 196a and 196b of the card-shaped storage medium 191 may be prepared as members independent of a member which constitutes the exterior appearance of the card-shaped storage medium 191, but part of the member which constitutes the exterior appearance of the card-shaped storage medium 191 may also be formed into projections. In this case, since the projections and the member which constitutes the exterior appearance of the card-shaped storage medium can be integrally formed, component costs and manufacturing costs can be reduced.

In addition, the projections 196a and 196b of the card-shaped storage medium 191 may be formed of material having electrical conductivity, such as metal or electrically conductive rubber, so that they can be utilized as grounding terminals and/or power source terminals. The projections 196a and 196b may also be formed to conduct electricity therebetween within the card-shaped storage medium 191, whereby the information processing apparatus can check the state of their electrical conduction and detect whether the card-shaped storage medium 191 has been connected to the connector 194.

As is apparent from the foregoing description, in accordance with the present embodiments, since projections are respectively provided on guide portions of a connector or the like within the information processing apparatus, a card-shaped storage medium is temporarily fastened between the guide portions by the projections. When the card-shaped storage medium is mounted in the information processing apparatus in such a state, the card-shaped storage medium is held by not only an electrode terminal portion but also the projections. Accordingly, if a user is to accidentally eject the card-shaped storage medium from the information processing apparatus or a vibration or the like is applied to the information processing apparatus, it is possible to prevent the card-shaped storage medium from easily coming off from the information processing apparatus. In addition, even if the user takes his/her hand off the card-shaped storage medium while the card-shaped storage medium is being ejected from the connector, the card-shaped storage medium is lightly fastened between the guide portions, whereby the card-shaped storage medium can be prevented from dropping and being damaged.

In accordance with the present embodiments, since projections are formed integrally with part of guide portions or part of a member which forms the exterior appearance of a card-shaped storage medium, similar effects can be obtained without increasing component costs or manufacturing costs. In accordance with the present embodiments, since such projections are formed of material having electrical conductivity, such as metal or electrically conductive rubber, and associated electrode terminals are formed, the number of electrode terminals of the card-shaped storage medium can be reduced or the contact resistance of the electrode terminals can be lowered. Accordingly, it is possible to reduce the size of the card-shaped storage medium as well as the force required to insert or eject the card-shaped storage medium from the information processing apparatus.

In accordance with the present embodiments, members having elasticity are provided on part of the exteriors of guide portions for a card-shaped storage medium in the form of projections which project inward from the respective guide portions, and recesses are formed in the card-shaped storage medium at locations respectively selected to correspond to the projections of the guide portions for the card-shaped storage medium. Accordingly, when the card-shaped storage medium is completely inserted between the guide portions and/or while the card-shaped storage medium is being ejected, predetermined ones of the projections are fitted to the corresponding ones of the recesses so that the user can obtain a distinct click touch and readily judge, for example, whether the card-shaped storage medium has been completely mounted in the information processing apparatus.

In accordance with the present embodiments, since projections are provided on part of the exterior of a card-shaped storage medium, it is possible to provide effects, such as the effect of preventing the card-shaped storage medium from being damaged without scratching the exterior faces of the card-shaped storage medium. Particularly when the user is to accidentally eject the card-shaped storage medium from the information processing apparatus during the use of the card-shaped storage medium, the card-shaped storage medium can be prevented from coming off from the information processing apparatus, thereby preventing the contents stored in the card-shaped storage medium from being damaged or broken.

What is claimed is:

1. A storage medium to be removably mounted in an information processing apparatus, comprising:

(a) memory means for storing data;

(b) a connector portion for electrically connecting to said storage medium and said information processing apparatus to each other; and (c) an engagement portion provided on an exterior case of said storage medium, for temporarily engaging with an information processing apparatus at a first position, at which the connector portion and the information processing apparatus are electrically connected to each other, and a second position different from said first position.

2. A storage medium according to claim 1, wherein said engagement portion is provided on one side face of said storage medium.

3. A storage medium according to claim 1, wherein said engagement portion is engaged with an elastic member provided in said information processing apparatus.

4. A storage medium according to claim 2, wherein said engagement portion is provided on both side surfaces of said storage medium.

5. A card adapter for mounting a second card-shaped storage medium having a format different from the format of a first card-shaped storage medium in an information processing apparatus capable of mounting therein said first card-shaped storage medium, said adapter comprising:

(a) a mounting portion in which to mount said second card-shaped storage medium; and (b) a first connector portion which is to be electrically connected to said information processing apparatus, wherein said mounting portion is arranged so as to be mounted such that a part of said second card-shaped storage medium projects from said information processing apparatus with said adapter connected to said information processing apparatus.

6. A card adapter according to claim 5, wherein said card adapter has a shape similar to a large card-shaped storage medium which is larger than said second card-shaped storage medium and is able to be mounted in said information processing apparatus.

7. A card adapter according to claim 5, wherein said first connector portion has first electrode terminals for engaging with said information processing apparatus and outputting data from said second card-shaped storage medium to said information processing apparatus.

8. A card adapter according to claim 5, further comprising:

a second connector poriton which is to be electrically connected to said second card-shaped medium;

wherein said second connector portion includes second electrode terminals for inputting data of said second card-shaped storage medium in said adapter.

9. A card adapter according to claim 8, wherein said first connector portion has first electrode terminals for outputting data from said second card-shaped storage medium to said information processing apparatus, and the number of said first electrode terminals is larger than the number of said second electrode terminals.

10. An information processing system comprising:

(a) a card adapter having a card mounting poriton for removably mounting a card-shaped storage medium, and a connector portion electrically connected to an information processing apparatus in order to output data from the mounted card-shaped storage medium to said information processing apparatus; and (b) an information processing apparatus having an adapter mounting portion in which to removably mount said card adapter, wherein a part of said card-shaped storage medium mounted in said card adapter projects from said information processing apparatus with said card adapter mounted in said information processing apparatus.

11. An information processing system according to claim 10, wherein said information processing apparatus includes engaging means for engaging said card adapter with said card adapter and said information processing apparatus electrically connected each other.

12. An information processing system according to claim 11, wherein said information processing apparatus includes ejecting means for ejecting said card adapter and said engaging means releases said card adapter from a state of being engaged by said engaging means according to an ejecting operation of said ejecting means.

13. An information processing apparatus comprising:

a mounting portion in which to removably mount a card-shaped storage medium;

a connector portion which is electrically connected to said card-shaped storage medium;

engaging means for engaging said card-shaped storage medium with said card-shaped storage medium and information processing apparatus electrically connected each other; and ejecting means for releasing an electrically connected state between said card-shaped storage medium and said information processing apparatus and ejecting said card-shaped storage medium, wherein said engaging means releases said card-shaped storage medium from a state of being engaged by said engaging means in conjunction with an ejecting operation of said ejecting means.

14. An information processing apparatus according to claim 13, wherein said card-shaped storage medium is a card adapter in which a card-shaped storage medium smaller than said card-shaped storage medium is mounted.

15. An information processing apparatus according to claim 13, wherein said connector portion and said card-shaped storage medium have electrode terminals, respectively, and each of the electrode terminals are engaged with each other to electrically connecting said information processing apparatus and said card-shaped storage medium.

* * * * *

UNITED STATES PATENT AND TRADEMARK OFFICE
CERTIFICATE OF CORRECTION

PATENT NO. : 6,385,040 B2
DATED : May 7, 2002
INVENTOR(S) : Hitoshi Nabetani and Yoshihiro Uchino It is certified that error appears in the above-identified patent and that said Letters Patent is hereby corrected as shown below:

Title page,
Item [62], Related U.S. Application Data, delete "6, 129,231" and insert -- 6,219,231 --.

Column 1,
Line 8, delete "6, 129,231" and insert -- 6,219,231 --.

Signed and Sealed this

Tenth Day of December, 2002

JAMES E. ROGAN
*Director of the United States Patent and Trademark Office*